United States Patent
Bauer

(10) Patent No.: US 7,863,163 B2
(45) Date of Patent: Jan. 4, 2011

(54) EPITAXIAL DEPOSITION OF DOPED SEMICONDUCTOR MATERIALS

(75) Inventor: Matthias Bauer, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 15 days.

(21) Appl. No.: 11/644,673

(22) Filed: Dec. 22, 2006

(65) Prior Publication Data
US 2007/0161216 A1    Jul. 12, 2007

Related U.S. Application Data

(60) Provisional application No. 60/754,569, filed on Dec. 22, 2005.

(51) Int. Cl.
*H01L 21/20* (2006.01)
*H01L 21/36* (2006.01)

(52) U.S. Cl. .................. 438/481; 438/300; 438/758; 257/E21.102; 257/E21.103

(58) Field of Classification Search .............. None
See application file for complete search history.

(56) References Cited

U.S. PATENT DOCUMENTS

| | | |
|---|---|---|
| 4,058,430 A | 11/1977 | Suntola et al. |
| 4,413,022 A | 11/1983 | Suntola et al. |
| 4,747,367 A | 5/1988 | Posa |
| 4,761,269 A | 8/1988 | Conger et al. |
| 4,910,153 A | 3/1990 | Dickson |
| 5,068,203 A | 11/1991 | Logsdon et al. |
| 5,071,670 A | 12/1991 | Kelly |
| 5,124,278 A | 6/1992 | Bohling et al. |
| 5,153,295 A | 10/1992 | Whitmarsh et al. |
| 5,175,330 A | 12/1992 | Speier |
| 5,225,032 A * | 7/1993 | Golecki ............... 117/90 |
| 5,306,666 A | 4/1994 | Izumi |
| 5,426,329 A | 6/1995 | Tsuchimoto |
| 5,674,781 A | 10/1997 | Huang et al. |

(Continued)

FOREIGN PATENT DOCUMENTS

DE    19820147 A1    7/1999

(Continued)

OTHER PUBLICATIONS

Zhang et al. "Selective epitaxial growth using dichlorosilane and silane by low pressure chemical napor deposition", Microelectronic Engineering, 73-74, (2004) pp. 514-518.*

(Continued)

*Primary Examiner*—Matthew S Smith
*Assistant Examiner*—Shaka Scarlett
(74) *Attorney, Agent, or Firm*—Knobbe Martens Olson & Bear LLP

(57) ABSTRACT

A method for depositing a carbon doped epitaxial semiconductor layer comprises maintaining a pressure of greater than about 700 torr in a process chamber housing a patterned substrate having exposed single crystal material. The method further comprises providing a flow of a silicon source gas to the process chamber. The silicon source gas comprises dichlorosilane. The method further comprises providing a flow of a carbon precursor to the process chamber. The method further comprises selectively depositing the carbon doped epitaxial semiconductor layer on the exposed single crystal material.

39 Claims, 7 Drawing Sheets

U.S. PATENT DOCUMENTS

| | | | |
|---|---|---|---|
| 5,711,811 A | 1/1998 | Suntola et al. | |
| 5,769,950 A | 6/1998 | Takasu et al. | |
| 5,831,335 A | 11/1998 | Miyamoto | |
| 5,837,580 A | 11/1998 | Thakur et al. | |
| 5,879,459 A | 3/1999 | Gadgil et al. | |
| 5,897,705 A | 4/1999 | Siebert et al. | |
| 5,904,565 A | 5/1999 | Nguyen et al. | |
| 5,916,365 A | 6/1999 | Sherman | |
| 5,933,761 A | 8/1999 | Lee | |
| 5,942,049 A | 8/1999 | Li et al. | |
| 6,037,258 A | 3/2000 | Liu et al. | |
| 6,042,654 A | 3/2000 | Comita et al. | |
| 6,048,790 A | 4/2000 | Iacoponi et al. | |
| 6,069,068 A | 5/2000 | Rathore et al. | |
| 6,077,775 A | 6/2000 | Stumborg et al. | |
| 6,083,818 A | 7/2000 | Stumborg et al. | |
| 6,093,368 A | 7/2000 | Rafferty et al. | |
| 6,100,184 A | 8/2000 | Zhao et al. | |
| 6,139,700 A | 10/2000 | Kang et al. | |
| 6,146,517 A | 11/2000 | Hoinkis | |
| 6,153,920 A * | 11/2000 | Gossmann et al. | 257/607 |
| 6,159,828 A | 12/2000 | Ping et al. | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,197,666 B1 | 3/2001 | Schafer et al. | |
| 6,197,669 B1 | 3/2001 | Twu et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,225,213 B1 | 5/2001 | Urabe | |
| 6,270,572 B1 | 8/2001 | Kim et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |
| 6,313,017 B1 | 11/2001 | Varhue | |
| 6,340,619 B1 | 1/2002 | Ko | |
| 6,342,448 B1 | 1/2002 | Lin et al. | |
| 6,351,039 B1 | 2/2002 | Jin et al. | |
| 6,358,829 B2 | 3/2002 | Yoon et al. | |
| 6,368,954 B1 | 4/2002 | Lopatin et al. | |
| 6,380,065 B1 | 4/2002 | Komai et al. | |
| 6,391,785 B1 | 5/2002 | Satta et al. | |
| 6,437,071 B1 | 8/2002 | Odaka et al. | |
| 6,444,495 B1 | 9/2002 | Leung et al. | |
| 6,455,417 B1 | 9/2002 | Bao et al. | |
| 6,458,718 B1 | 10/2002 | Todd | |
| 6,478,873 B1 | 11/2002 | Cheong et al. | |
| 6,482,733 B2 | 11/2002 | Raaijmakers et al. | |
| 6,555,839 B2 | 4/2003 | Fitzgerald | |
| 6,583,015 B2 | 6/2003 | Fitzgerald et al. | |
| 6,583,048 B1 | 6/2003 | Vincent et al. | |
| 6,593,191 B2 | 7/2003 | Fitzgerald | |
| 6,605,498 B1 | 8/2003 | Murthy et al. | |
| 6,630,413 B2 | 10/2003 | Todd | |
| 6,716,713 B2 | 4/2004 | Todd | |
| 6,727,169 B1 | 4/2004 | Raaijmakers et al. | |
| 6,821,825 B2 | 11/2004 | Todd et al. | |
| 6,900,115 B2 | 5/2005 | Todd | |
| 6,958,253 B2 | 10/2005 | Todd | |
| 6,962,859 B2 | 11/2005 | Todd et al. | |
| 6,969,875 B2 | 11/2005 | Fitzgerald | |
| 7,026,219 B2 | 4/2006 | Pomarede et al. | |
| 7,074,623 B2 | 7/2006 | Lochtefeld et al. | |
| 7,186,630 B2 | 3/2007 | Todd | |
| 7,195,985 B2 * | 3/2007 | Murthy et al. | 438/341 |
| 7,238,595 B2 | 7/2007 | Brabant et al. | |
| 7,332,439 B2 * | 2/2008 | Lindert et al. | 438/696 |
| 2001/0001742 A1 | 5/2001 | Huang et al. | |
| 2001/0034123 A1 | 10/2001 | Jeon et al. | |
| 2002/0003286 A1 | 1/2002 | Marty et al. | |
| 2002/0023520 A1 | 2/2002 | Hu | |
| 2002/0045359 A1 | 4/2002 | Todd | |
| 2002/0100933 A1 | 8/2002 | Marchant | |
| 2002/0127766 A1 | 9/2002 | Ries et al. | |
| 2002/0151153 A1 | 10/2002 | Drobny et al. | |
| 2002/0168868 A1 | 11/2002 | Todd | |
| 2002/0173113 A1 * | 11/2002 | Todd | 438/398 |
| 2003/0047129 A1 * | 3/2003 | Kawahara et al. | 117/2 |
| 2003/0082300 A1 | 5/2003 | Todd et al. | |
| 2003/0098465 A1 | 5/2003 | Suzumura et al. | |
| 2003/0178700 A1 | 9/2003 | Franosch et al. | |
| 2003/0219981 A1 | 11/2003 | Ammon et al. | |
| 2004/0031981 A1 | 2/2004 | Grivna | |
| 2004/0033674 A1 | 2/2004 | Todd | |
| 2004/0045499 A1 | 3/2004 | Langdo et al. | |
| 2004/0161617 A1 | 8/2004 | Todd | |
| 2004/0213907 A1 | 10/2004 | Todd et al. | |
| 2004/0224089 A1 * | 11/2004 | Singh et al. | 427/255.27 |
| 2004/0224504 A1 | 11/2004 | Gadgil | |
| 2004/0250298 A1 | 12/2004 | Pinkerton et al. | |
| 2004/0262694 A1 | 12/2004 | Chidambaram | |
| 2005/0023520 A1 | 2/2005 | Lee et al. | |
| 2005/0042888 A1 | 2/2005 | Roeder et al. | |
| 2005/0048745 A1 | 3/2005 | Todd | |
| 2005/0064684 A1 | 3/2005 | Todd et al. | |
| 2005/0079691 A1 * | 4/2005 | Kim et al. | 438/481 |
| 2005/0079692 A1 * | 4/2005 | Samoilov et al. | 438/481 |
| 2005/0208740 A1 | 9/2005 | Todd | |
| 2005/0250298 A1 | 11/2005 | Bauer | |
| 2006/0011984 A1 | 1/2006 | Currie | |
| 2006/0014366 A1 | 1/2006 | Currie | |
| 2006/0115933 A1 | 6/2006 | Ye et al. | |
| 2006/0115934 A1 | 6/2006 | Kim et al. | |
| 2006/0148151 A1 | 7/2006 | Murthy et al. | |
| 2006/0166414 A1 | 7/2006 | Carlson et al. | |
| 2006/0169668 A1 | 8/2006 | Samoilov | |
| 2006/0169669 A1 | 8/2006 | Zojaji et al. | |
| 2006/0205194 A1 | 9/2006 | Bauer | |
| 2006/0234504 A1 | 10/2006 | Bauer et al. | |
| 2006/0240630 A1 | 10/2006 | Bauer et al. | |
| 2006/0289900 A1 | 12/2006 | Thirupapuliyur et al. | |
| 2007/0161316 A1 | 7/2007 | Taguchi et al. | |
| 2007/0287272 A1 | 12/2007 | Bauer et al. | |
| 2008/0026149 A1 | 1/2008 | Tomasini et al. | |

FOREIGN PATENT DOCUMENTS

| | | |
|---|---|---|
| JP | 04-159284 | 6/1992 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/66832 A3 | 9/2001 |
| WO | WO 01/78123 A1 | 10/2001 |
| WO | WO 01/78124 A1 | 10/2001 |

WO WO 01/99166 A1 12/2001

OTHER PUBLICATIONS de Boer, W.B and Meyer, D.J., "Low-Temperature Chemical Vapor Deposition of Epitaxial Si and SiGe Layers at Atmospheric Pressure." Appl. Phys. Lett., vol. 58, No. 12 (Mar. 25, 1991): pp. 1286-1288.

Garone, P.M., et al. "Silicon Vapor Phase Epitaxial Growth Catalysis by the Presence of Germane." Appl. Phys. Lett., vol. 56, No. 113 (Mar. 26, 1990): pp. 1275-1277.

Ng, Kwok K.., Complete Guide to Semiconductor Devices. $2^{nd}$ Edition. IEEE Press, Wiley-Interscience, John Wiley & Sons, Inc. (2002): p. 676.

Wang, Weichung; Denton, Jack; and Neudeck, Gerold W. "Low Temperature Silicon Selective Epitaxial Growth (SEG) and Phosphorous Doping in a Reduced-Pressure Pancake Reactor." ECE Technical Reports. Electrical and Computer Engineering, Purdue University Libraries (1992). <hhtp://docs.lib.purdue.edu/ecetr/299>.

PCT Search Report, PCT Application PCT/US2006/003333; Jun. 30, 2006.

PCT Search Report, PCT Application PCT/US2006/003465; Jul. 7, 2006.

O'Neil et al., "Optimization of process conditions for selective silicon epitaxy using disilane, hydrogen, and chlorine", J. Electrochem. Soc. 144(9), pp. 3309-3315 (1997).

Abeles et al.; *Amorphous Semiconductor Superlattices*; Physical Review Letters; Nov. 21, 1983; pp. 2003-2006; vol. 51; No. 21.

Agnello et al., "Conditions for an oxide-free Si surface for low-temperature processing: steady state boundary", *J. Electrochem. Soc.* 139(10), pp. 2929-2934 (Oct. 1992).

Agnello et al., "Growth rate enhancement of heavy $n$- and $p$-type doped silicon deposited by atmospheric-pressure chemical vapor deposition at low temperatures", *J. Electrochem. Soc.* 140(9), pp. 2703-2709 (Sep. 1993).

Agnello et al., "Heavy arsenic doping of silicon grown by atmospheric-pressure chemical vapor deposition at low temperatures", *Appl. Phys. Lett.* 60(4), pp. 454-456 (Jan. 27, 1992).

Agnello et al., "Inhibition of silicon oxidation during low temperature epitaxial growth", *J. Electrochem. Soc.* 139(4), pp. 1140-1146 (Apr. 1992).

Agnello et al., "Selective growth of silicon-germanium alloys by atmospheric-pressure chemical vapor deposition at low temperature", *Appl. Phys. Left.* 59(12), pp. 1479-1481 (Sep. 16, 1991).

Agnello et al., "Silicon epitaxy from silane by atmospheric-pressure chemical vapor deposition at low temperatures", *Appl. Phys. Lett.* 61(11), pp. 1298-1300 (Sep. 14, 1992).

Agnello et al., "The use of gas monitors to characterize a low-temperature atmospheric-pressure epitaxial system", *J. Electrochem. Soc.* 138(9), pp. 2785-2789 (Sep. 1991).

Alerhand et al., "Adsorption of As on stepped Si(100): resolution of the sublattice-orientation dilemma", *Physical Review B* 44(12), pp. 6534-6537 (Sep. 15, 1991).

Ang, et al., "Thin body silicon-on-insulator N-MOSFET with silicon-carbon source/drain regions for performance enhancement", Electron Devices Meeting, IEDM Technical Digest, pp. 497-500 (Dec. 5, 2005).

Antonell et al., "Carbon incorporation for strain compensation during solid phase epitaxial recrystallization of SiGe on Si at 500-600°C", J. Appl. Phys. 79 (10), pp. 7646-7651 (1996).

Ban et al., "Chemical processes in vapor deposition of silicon", *J. Electrochem. Soc.* 122(10), pp. 1382-1388 (Oct. 1975).

Ban, "Chemical processes in vapor deposition of silicon", *J. Electrochem. Soc.* 122(10), pp. 1389-1391 (Oct. 1975).

Bauer et al., "Si$_3$H$_8$ based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond Sci. Technol; 1993; 1052-1062; vol. 8.

Brabant et al., "Achieving a SiGe HBT epitaxial emitter with novel low thermal budget technique", *Applied Surface Science* 224, pp. 347-349 (2004).

Carroll, et al., "Thermal stability and substitutional carbon incorporation far above solid-solubility in $Si_{1-x}C_x$ and $Si_{1-x-y}Ge_xC_y$ layers grown by chemical vapor deposition using disilane", Mat. Res. Sec. Symp. Proc. vol. 717, pp. C4.3.1-C4.3.7 (2002).

Chadi et al., "Fermi-level-pinning defects in highly $n$-doped silicon", *Physical Review Letters* 79(24), pp. 4834-4837 (Dec. 15, 1997).

Citrin et al., "Geometric frustration of 2D dopants in silicon: surpassing electrical saturation", *Physical Review Letters* 83(16), pp. 3234-3237 (Oct. 18, 1999).

Comfort et al., "Plasma-enhanced chemical vapor deposition of in situ doped epitaxial silicon at low temperatures", *J. Appl. Phys.* 65(3), pp. 1053-1066 (Feb. 1, 1989).

Coon et al., "Adsorption and desorption kinetics for $SiH_2CA_2$ on Si(111) 7x7", *J. Vac. Sci. Technol.* A10(2), pp. 324-333 (Mar./Apr. 1992).

Cowher et al., "Chemical vapor deposited polycrystalline silicon", *J. Electrochem. Soc.* 119(11), pp. 1565-1569 (Nov. 1972).

Düscö et al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Eguchi et al., "Comparison of arsenic and phosphorus diffusion behavior in silicon-germanium alloys", *Appl. Phys. Lett.* 80(10), pp. 1743-1745 (Mar. 11, 2002).

Erbil et al., "Lattice distortions for arsenic in single-crystal silicon", *Physical Review B* 34(2), pp. 1392-1394 (Jul. 15, 1986).

Eversteyn et al., "Influence of $AsH_3$, $PH_3$, $B_2H_6$ on the growth rate and resistivity of polycrystalline silicon films deposited from a $SiH_4$—$H_2$ mixture", *J. Electrochem. Soc.* 120(1), pp. 106-110 (Jan. 1973).

Fair et al., "Effect of complex formation on diffusion of arsenic in silicon", *J. Appl. Phys.* 44(1), pp. 273-279 (Jan. 1973).

Farrow et al., "Inhibition of silicon growth rate during the deposition of arsenic-doped epitaxial silicon layers on silicon by pyrolysis of silane", *J. Electrochem.* Soc. 118(1), pp. 149-150 (Jan. 1971).

Farrow, "The kinetics of silicon deposition on silicon by pyrolysis of silane", *J. Electrochem. Soc.* 121(7), pp. 899-907 (Jul. 1974).

Fazan et al.; *A High-C Capacitor (20.4 Ff/µm2) with Ultrathin CVD—Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

Gates et al., "Kinetics of surface reactions in very low-pressure chemical vapor deposition of Si from $SiH_4$", *Appl. Phys. Lett.* 58(25), pp. 2963-2965 (Jun. 24, 1991).

Gates et al., "Surface reactions in Si chemical vapor deposition from silane", *J. Vac. Sci. Technol.* A8(3), pp. 2965-2969 (May/Jun. 1990).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Ghidini et al., "Interaction of $H_2O$ with Si(111) and (100)" *J. Electrochem. Soc.* 131(12), pp. 2924-2928 (Dec. 1984).

Goodwin, et al., "Diamond thin film deposition in low-pressure premixed flames", Proc. Combust. Inst., vol. 26, pp. 1817-1824 (1996).

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Holsteyns et al., "Process monitoring and qualification of CVD/PVD tools using comprehensive surface haze information", Proceedings of the Yield Management Seminar, Japan (2002).

Horiike et al.; *Filling of Si Oxide into a Deep Trench using Digital CVD Method*; Applied Surface Science; 1990; pp. 168-174; vol. 46.

Hoyt, "Substitutional carbon incorporation and electronic characterization of $Si_{1-y}C_y/Si$ and $Si_{1-x-y}Ge_xC_y/Si$ heterojunctions", Chapter 3 in "Silicon-Germanium Carbon Alloy", Taylor and Francis (New York, NY), pp. 59-89 (2002).

Hsieh et al., "Role of dopant incorporation in low-temperature Si epitaxial growth by rapid thermal processing chemical vapor deposition", IEEE Transactions on Electron Devices 39(1), pp. 203-205 (Jan. 1, 1992).

Hsieh et al., "Selective deposition of in situ doped polycrystalline silicon rapid thermal processing chemical vapor deposition", *Appl. Phys. Lett.* 55(23), pp. 2408-2410 (Dec. 4, 1989).

Hsieh et al., "Silicon homoepitaxy by rapid thermal processing chemical vapor deposition (RTPCVD)—a review", *J. Electrochem. Soc.* 138 (4), pp. 1207 (Apr. 1991).

Hsieh et al., "Study of rapid thermal precleaning for Si epitaxial growth", *J. Electrochem. Soc.* 139(7), pp. 1971-1978 (Jul. 1992).

Ide, "Formation of step structures by As deposition on a double-domain Si(001) substrate", *Physical Review B* 51(3), pp. 1722-1728 (Jan. 15, 1995).

Jang et al., "Chemical vapour deposition of epitaxial silicon-germanium from silane and germane", *J. Electrochem. Soc.* 142(10), pp. 3520-3527 (Oct. 1995).

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Jung et al., "In situ doping of $Ge_xSi_{1-x}$ with arsenic by rapid thermal processing chemical vapor deposition", *Appl. Phys. Lett.* 60(6), pp. 724-726 (Feb. 10, 1992).

Juppo et al.; *Deposition of copper films by an alternate supply of CuCl and Zn*; J. Vac. Sci. Technol.; 1997; pp. 2003; vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kamins et al., "Control of n-type dopant transitions in low-temperature silicon epitaxy", *J. Electrochem. Soc.* 144(2), pp. 674-678 (Feb. 1997).

Katsuki, et al., "The oxidation and reduction behavior of metal surface in a flame", JSME Int. J., Ser. 2, 35-1, pp. 110-115 (1992).

Kee, et al., "The influence of pressure, fluid flow, and chemistry on the combustion-based oxidation of silicon", Proc. Combust. Inst., vol. 28, pp. 1381-1388 (2000).

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

King et al., "Suppression of arsenic autodoping with rapid thermal epitaxy for low power bipolar complementary metal oxide semiconductor", *J. Electrochem. Soc.* 142(7), pp. 2430-2434 (Jul. 1995).

Klaus et al.; *Atomic Layer Deposition of SiO2 Using Catalyzed and Uncatalyzed Self-Limiting Surface Reactions*; Surface Review and Letters; 1999; pp. 435-448; vol. 6, No. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of Ti AlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58, (2002).

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Kurokawa, "P-doped polysilicon film growth technology", *J. Electrochem. Soc.* 129(11), pp. 2620-2624 (Nov. 1982).

Lawther et al., "Vacancy generation resulting from electrical deactivation of arsenic", *Appl. Phys. Lett.* 67(24), pp. 3575-3577 (Dec. 11, 1995).

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

Liehr et al., "Equilibrium surface hydrogen coverage during silicon epitaxy using $SiH_4$", *J. Vac. Sci. Technol.* A8(3), pp. 2960-2964 (May/Jun. 1990).

Liehr et al., "Kinetics of silicon epitaxy using $SiH_4$ in a rapid thermal chemical vapor deposition reactor", *Appl. Phys. Lett.* 56(7), pp. 629-631 (Feb. 12, 1990).

Lietoila et al., "Metastable As-concentrations in Si achieved by ion implantation and rapid thermal annealing", *J. Appl. Phys.* 52(1), pp. 230-232 (Jan. 1981).

Lietoila et al., "Solid solubility of As in Si as determined by ion implantation and cw laser annealing", *Appl. Phys. Lett.* 35(7), pp. 532-534 (Oct. 1, 1979).

Lietoila et al., "The solid solubility and thermal behaviour of metastable concentrations of As in Si", *Appl. Phys. Lett.* 36(9), pp. 765-768 (May 1, 1980).

Loo et al., "In-line and non-destructive analysis of epitaxial $Si_{1-x-y}Ge_xC_y$ by spectroscopic ellipsometry and comparison with other established techniques", Electrochemical Society Proceedings Mar. 2003, pp. 329-338 (2003).

Loo et al., "Successful selective epitaxial $Si_{1-x}Ge_x$ deposition process for HBT—BiCMOS and high mobility heterojunction pMOS applications", *J. Electrochem. Soc.* 150(10), pp. G638-G647 (2003).

Macknight et al., "RTP applications and technology options for the sub-45 nm node", Proceedings, RTP2004 Conference (Portland, OR) (2004).

Madsen et al., "In situ doping of silicon films prepared by low pressure chemical vapor deposition using disilane and phosphine", *J. Electrochem. Soc.* 137(7), pp. 2246-2251 (1990).

Martensson et al.; *Atomic layer epitaxy of copper an ab initio investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

Mathiot et al., "Diffusion of arsenic in silicon: validity of the percolation model", *Appl. Phys. Lett.* 42(12), pp. 1043-1044 (Jun. 15, 1983).

McCarty, et al., "Scaleable stagnation-flow reactors for uniform materials deposition: Application to combustion synthesis of diamond", Applied Physics Letters, vol. 63, pp. 1498-1500 (Sep. 13, 1993).

Meeks, et al., "Computational simulation of diamond chemical vapor deposition in premixed $C_2H_2/O_2/H_2$ and $CH_4/O_2$-strained flames", Combustion and Flame, vol. 92, pp. 144-160 (Jan. 1993).

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Meuris et al., "A new cleaning concept for particle and metal removal on Si surfaces", Third International Symposium on Cleaning Technology in Semiconductor Device Manufacturing, 184th Electrochemical Society Meeting, pp. 15-25 (1993).

Meuris et al., "Implementation of the IMEC-Clean in advanced CMOS manufacturing", Proceedings of the 1999 IEEE International Symposium on Semiconductor Manufacturing, pp. 157-160 (1999).

Meyerson et al., "Bistable conditions for low-temperature silicon epitaxy", *Appl. Phys. Lett.* 57(10), pp. 1034-1036 (Sep. 3, 1990).

Meyerson et al., "Low temperature silicon epitaxy by hot wall ultrahigh vacuum/low pressure chemical vapor deposition techniques: surface optimization", *J. Electrochem. Soc.* 133(6), pp. 1232-1235 (Jun. 1986).

Meyerson et al., "Phosphorus-doped polycrystalline silicon via LPCVD", *J. Electrochem. Soc.* 131(10), pp. 2361-2365 (Oct. 1984).

Meyerson et al., "Phosphorus-doped polycrystalline silicon via LPCVD", *J. Electrochem. Soc.* 131(10), pp. 2366-2368 (Oct. 1984).

Meyerson, "Low-temperature silicon epitaxy by ultrahigh vacuum/chemical vapor deposition", *Appl. Phys. Lett.* 48(12), pp. 797-799 (Mar. 24, 1986).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films; Applied Physics Letters*; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Miner, et al., "Enabling single-wafer process technologies for reliable ultra-thin gate dielectrics", Electrochemical Society Proceedings, vol. 99-10, pp. 3-13 (1999).

Miyauchi et al., "Incorporation of oxygen and chlorine atoms into low-temperature (850°C) silicon epitaxial films by chemical vapor deposition", *Appl. Phys. Lett.* 66(21), pp. 2867-2869 (May 22, 1995).

Moller; *Copper and Nickel Ultrathin Films on Metal-Oxide Crystal Surfaces*Mater. Soc. Monogr.; 1994; 473-522; 81.

Murayama, et al., "Uniform deposition of diamond films using a flat flame stabilized in the stagnation-point flow", Journal of Applied Physics, vol. 69, pp. 7924-7926 (Jun. 1, 1991).

Murota et al., "In-situ heavy doping of P and B in low-temperature $Si_{1-x}Ge_x$ epitaxial growth using ultraclean LPCVD", Electrochemical Society Proceedings 98-1, pp. 822-833 (1998).

Niinistö et al.; *Synthesis of oxide thin films and overlayers by atomic layer epitaxy for advanced applications*; Materials Science and Engineering; 1996; pp. 23-29; vol. B41.

O'Neil et al., "Optimization of process conditions for selective silicon epitaxy using disilane, hydrogen, and chlorine", J. Electrochem. Soc. 144 (9), pp. 3309-3315 (1997).

Oehme et al, "Carbon segregation in silicon", Thin Solid Films, 380(1-2), pp. 75-77 (Dec. 22, 2000).

Oehme et al., "A novel measurement method of segregating adlayers in MBE", Thin Solid Films 369, pp. 138-142 (2000).

Ohno et al., "Step structures and interface morphology: arsenic on vicinal silicon surfaces", *J. Vac. Sci. Technol.* B8(4), pp. 874-883 (Jul./Aug. 1990).

Okuyama et al., "Growth of oriented Si film on quartz from Si3H8 by thermal and photo-CVD using a D2 lamp", Japanese Journal of Applied Physics, Part 2 (ISSN 0021-4922), vol. 27, p. L499-L501, Apr. 1988, abstract.

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al., "Substitutional versus interstitial carbon incorporation during psuedomorphic growth of $Si_{1-y}C_y$ on Si(001)", J. Appl. Phys. 80 (12), pp. 6711-6715 (1996).

Ott et al., "Arsenic desorption kinetics from Si(100)", *Surface Science* 405, pp. 228-238 (1998).

Ott et al.; *Modification of Porous Alumina membranes Using Al2O3 Atomic Layer Controlled Deposition*; Chem. Mater.; 1997; pp. 707-714; vol. 9.

PCT Search Report for PCT/US 06/47646, mailing date Oct. 4, 2007.

Pandey et al., "Annealing of heavily arsenic-doped silicon: electrical deactivation and a new defect complex", *Physical Review Letters* 61(11), pp. 1282-1285 (Sep. 12, 1988).

Peercy, "An eye for impurity", Nature 416, pp. 799-801 (Apr. 25, 2002).

Rai-Choudhury et al., "Growth and characterization of polycrystalline silicon", *J. Electrochem. Soc.* 120(12), pp. 1761-1766 (Dec. 1973).

Ramamoorthy et al., "Complex dynamical phenomena in heavily arsenic doped silicon" *Physical Review Letters* 76(25), pp. 4753-4756 (Jun. 17, 1996).

Ritala et al.; *Atomic Layer Epitaxy Growth of TiN Thin Films from TiIa and NH3*; J. Electrochem. Soc.; Aug. 1998; pp. 2914-2920; vol. 145; No. 8.

Ritala et al.; *Controlled Growth of TaN, Ta3N5, and TaOxNy Thin Films by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; ChemVap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999, pp. IITC 99-187-IITC 99-189.

Saarinen et al., "Identification of vacancy-impurity complexes in highly *n*-type Si", *Physical Review Letters* 82(9), pp. 1883-1886 (Mar. 1, 1999).

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Schwenker et al., "Arsenic clustering in silicon", *J. Appl. Phys.* 42(8), pp. 3195-3200 (Jul. 1971).

Sedgwick et al., "Atmospheric pressure chemical vapor deposition of Si and SiGe at low temperatures", *J. Vac. Sci. Technol.* A10(4), pp. 1913-1919 (Jul./Aug. 1992).

Sedgwick et al., "Effects of trace surface oxidation in low temperature epitaxy grown from dichlorosilane", *J. Electrochem. Soc.* 140(12), pp. 3684-3688 (Dec. 1993).

Sedgwick et al., "Growth of facet-free selective silicon epitaxy at low temperature and atmospheric pressure", *J. Electrochem. Soc.* 138(10), pp. 3042-3047 (Oct. 1991).

Sedgwick et al., "High phosphorus doping of epitaxial silicon at low temperature and atmospheric pressure", *Appl. Phys. Lett.* 58(17), pp. 1896-1898 (Apr. 29, 1991).

Sedgwick et al., "Low temperature atmospheric pressure chemical vapour deposition for epitaxial growth of SiGe bipolar transistors", *J. Electrochem. Soc.* 142(7), pp. 2458-2463 (Jul. 1995).

Sedgwick et al., "Low-temperature selective epitaxial growth of silicon at atmospheric pressure", *Appl. Phys. Lett.* 54(26), pp. 2689-2691 (Jun. 26, 1989).

Sedgwick et al., "Selective SiGe and heavily As doped Si deposited at low temperature by atmospheric pressure chemical vapor deposition", *J. Vac. Sci. Technol.* B11(3), pp. 1124-1128 (May/Jun. 1993).

Singer; *Atomic Layer Deposition Targets Thin Films*; Semiconductor International; Sep. 1999; pp. 40.

Smith et al., "Reaction of oxygen with Si(111) and (100): critical conditions for the growth of $SiO_2$", *J. Electrochem. Soc.* 129(6), pp. 1300-1306 (Jun. 1982).

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y$/Si heterostructures", J. Appl. Phys. 76 (6), pp. 3656-3668 (1994).

Strobel et al, "Flame surface modification of polypropylene film", J. Adhesion Sci. Technol., vol. 10, No. 6, pp. 515-539 (1996).

Sugiyama et al., "Kinetics of arsenic doping in silicon by ultra-high-vacuum chemical vapour deposition", *Journal of Crystal Growth* 150, pp. 994-998 (1995).

Suvar et al., "Phosphorus profile control in low-temperature silicon epitaxy by reduced pressure chemical vapor deposition", *Materials Science and Engineering* B89, pp. 314-318 (2002).

Swihart, et al., "Ab initio molecular orbital study of the thermochemistry and reactions of the chlorinated disilenes and their isomers ($Si_2HnC\Lambda_{4-n}$)", Journal of Physical Chemistry, vol. 102, No. 4, pp. 785-792 (Jan. 22, 1998).

Swhihart, et al., "On the mechanism of homogeneous decomposition of the chlorinated silanes; chain reactions propagated by divalent silicon species", Journal of Physical Chemistry, vol. 102, No. 9, pp. 1542-1549 (Feb. 26, 1998).

Swihart, et al., "Thermochemistry and thermal decomposition of the chlorinated disilanes ($Si_2HnC\Lambda_6$_n$, n=0-6) studied by ab initio molecular orbital methods", Journal of Physical Chemistry, vol. 101, No. 40, pp. 7434-7445 (Oct. 2, 1997).

Swihart, Mark T., "Assembling gas-phase reaction mechanisms for high temperature inorganic systems based on quantum chemistry calculations and reaction rate theories", Journal of Physics and Chemistry of Solids, 66, pp. 364-371 (2005).

Tao et al., "Crystal growth in silicon chemical vapor deposition from silane", J. Electrochem. Soc. 144(6), pp. 2221-2225 (Jun. 1997).

Tedder et al., "Dynamic rate and thickness metrology during poly-Si rapid thermal chemical vapor deposition from $SiH_4$ using real time in situ mass spectrometry", J. Vac. Sci. Technol. A14(2), pp. 267-270 (Mar./Apr. 1996).

Tiitta et al.; *Preparation and Characterization of Phosphorus-Doped Aluminum Oxide Thin Films*; Materials Research Bulletin; 1998; pp. 1315-1323; vol. 33, No. 9.

Tsukidate et al., "Growth kinetics and doping mechanism in phosphorus-doped Si gas-source molecular beam epitaxy", *Applied Surface Science* 175-176, pp. 43-48 (2001).

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Uhrberg et al., "Electronic and atomic structure of arsenic terminated Si(100)", J. Vac. Sci. Technol. A4(3), pp. 1259-1264 (May/Jun. 1986).

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Voyles et al., "Atomic-scale imaging of individual dopant atoms and clusters in highly *n*-type bulk Si", *Nature* 416, pp. 826-829 (Apr. 25, 2002).

Wang; *Spin On Dielectric Films—A General Overview*, 1998 5th International Conference on Solid-State and Integrated Circuit Technology Proceedings; Oct. 21-23, 1998; p. 961; Beijing, China.

Whitman et al., "The chemisorption of chlorosilanes and chlorine on Si(111) 7x7", *Surface Science* 232, pp. 297-306 (1990).

Williams et al., "Metastable doping behavior in antimony-implanted (100) silicon", J. Appl. Phys. 53(12), pp. 8663-8667 (Dec. 1982).

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon*; Mat. Res. Soc. Symp. Proc.; 1994; pp. 37-43; vol. 334.

Wolf et al.; *Process and Equipment Simulation of Copper Chemical Vapor Deposition Using Cu(hfac)vtms*; Microelectronic Engineering; 1999; 15-27; 45.

Xie et al., "Arsenic doping kinetics in silicon during gas source molecular beam epitaxy", *Surface Science* 397, pp. 164-169 (1998).

Xie et al., "Arsenic surface segregation and incorporation in Si and $Si_{1-x}Ge_x$ during gas source molecular beam epitaxy", *Journal of Crystal Growth* 173, pp. 336-342 (1997).

Xie et al., "Surface segregation during molecular beam epitaxy: the site-blocking effects of surfactant atoms", *Surface Science* 367, pp. 231-237 (1996).

Yagi et al.; *Substitutional C incorporation into Si1-yCy alloys using novel carbon source, 1,3-disilabutane*; Japanese Journal of Applied Physics; 2004; pp. 4153-4154; vol. 43, No. 7A.

Yu et al., "The adsorption of $PH_3$ on Si(100) and its effect on the coadsorption of $SiH_4$", J. Vac. Sci. Technol. A2(2), pp. 446-449 (Apr./Jun. 1984).

Zhang, et al., "Embedded SiGe S/D PMOS on thin body SOI substrate with drive current enhancement", Symposium on VLSI Technology, Digest of Technical Papers, pp. 26-27 (Jun. 14, 2005).

Hallstedt, J. et al., Journal of Applied Physics 103, 054907 (2008) "Pattern dependency in selective epitaxy of B-doped SiGe layers for advanced metal oxide semiconductor field effect transistors".

Hallstedt, J. et al., *Materials Science and Engineering* B 109 (2004) 122-126 "Methods to reduce the loading effect in selective and non-selective epitaxial growth of sigee layers".

Loo, R. et al., "Selective Epitaxy of Si/SiGe to Improve pMOS Devices by Recessed Source/Drain and/or Buried SiGe Channels", *2nd ECS Transactions*, 2006; vol. 3; NUMB 7 p. 453-466.

Loo, R. et al., "Successful Selective Epitaxial $Si_{1-x}Ge_x$ Deposition Process for HBT-BiCMOS and High Mobility Heterojunction pMOS Applications", J. Electrochem. Soc. 150 (10), pp. G638-G647 (2003).

PCT International Search Report; International application No. PCT/US2005/13674, Apr. 2005.

PCT International Preliminary Report on Patentability; International application No. PCT/US2006/047646, dated Jul. 3, 2008.

Purdue University "Low Temperature Silicon Selective Epitaxial Growth (SEG) and Phosphorous Doping in a Reduced-Pressure Pancake Reactor," Wang et al., TR-EE 92-13 Apr. 1992.

Purdue University, *Chemical Engineering Science*, vol. 43, No. 8, pp. 2031-2036, 1988 "Selective Epitaxial Growth of Silicon Pancake Reactors," Kastelic et al.

*Complete Guide to Semiconductor Devices*, 2nd Ed., Kwok K. Ng, IEEE Press, 2002, Appendix D4, Resistivity and Mobility, p. 676.

Abstract "Al Diffusion into Glass Films Used for the Passivation of Fine Al Metallization", Tanikawa, Microelectronics Research Laboratories, NEC Corp, Japan, Oct. 1991.

\* cited by examiner

EPITAXIAL DEPOSITION OF DOPED SEMICONDUCTOR MATERIALS

PRIORITY APPLICATIONS

This application claims the benefit of U.S. Provisional Patent Application 60/754,569 (filed 22 Dec. 2005), the entire disclosure of which is hereby incorporated by reference herein.

CROSS-REFERENCE TO RELATED APPLICATIONS

This application is related to U.S. patent application Ser. No. 11/113,829 (filed 25 Apr. 2005;); U.S. patent application Ser. No. 11/343,275 (filed 30 Jan. 2006;); U.S. patent application Ser. No. 11/343,264 (filed 30 Jan. 2006;); and U.S. patent application Ser. No. 11/343,244 (filed 30 Jan. 2006. The entire disclosure of all of these related applications is hereby incorporated by reference herein.

FIELD OF THE INVENTION

The present invention relates generally to epitaxial deposition, and more particularly to in situ selective epitaxial deposition of carbon-doped semiconductor materials.

BACKGROUND OF THE INVENTION

A variety of methods are used in the semiconductor manufacturing industry to deposit materials onto surfaces. For example, one of the most widely used of such methods is chemical vapor deposition ("CVD"), in which atoms or molecules contained in a vapor deposit on a surface and build up to form a film. Deposition of silicon containing materials using conventional silicon sources and deposition methods on certain surfaces, such as insulators, is believed to proceed in several distinct stages. Nucleation, the first stage, occurs as the first few atoms or molecules deposit onto the surface and form nuclei. Nucleation is greatly affected by the nature and quality of the underlying substrate surface. During the second stage, the isolated nuclei form small islands that grow into larger islands. In the third stage, the growing islands begin coalescing into a continuous film. At this point, the film typically has a thickness of a few hundred angstroms and is known as a "transition" film. It generally has chemical and physical properties that are different from the thicker bulk film that begins to grow after the transition film is formed.

In some applications, it is desirable to achieve uniform or "blanket" deposition over both insulating (for example, silicon oxide) and semiconductive (for example, silicon) surfaces. In other applications, it is desirable to deposit selectively on semiconductor windows exposed within fields of different materials, such as field isolation oxide. For example, heterojunction bipolar transistors are often fabricated using selective deposition techniques that epitaxially deposit single crystal semiconductor films only on active areas. Other transistor designs benefit from elevated source/drain structures, which provide additional silicon to be consumed by the source/drain contact process, thus leaving the performance of the resulting shallow junction device unaffected. Selective epitaxy on source/drain regions advantageously allows the number of subsequent patterning and etching steps to be reduced.

Generally, selective deposition takes advantage of differential nucleation during deposition on different materials. Selective deposition generally involves simultaneous etching and deposition of the material being deposited. The precursor of choice generally has a tendency to nucleate and grow more rapidly on one surface and less rapidly on another surface. For example, silane will eventually deposit silicon on both silicon oxide and silicon, but there is a significantly longer nucleation phase on silicon oxide. Thus, at the beginning of a nucleation stage, discontinuous films on oxide have a high exposed surface area relative to merged, continuous films on silicon. Accordingly, an etchant added to the process will have a greater effect upon the poorly nucleating film over oxide as compared to the rapidly nucleating film over silicon. The relative selectivity of a process is thus tunable by adjusting factors that affect the deposition rate (for example, precursor flow rate, temperature, and pressure) and the rate of etching (for example, etchant flow rate, temperature, and pressure). Changes in variables such as these generally result in differential effects upon etch rate and deposition rate. Typically, a selective deposition process is tuned to produce the highest deposition rate feasible on the window of interest while accomplishing little or no deposition in the field regions. Known selective silicon deposition processes include reactants such as silane and hydrochloric acid with a hydrogen carrier gas.

A variety of approaches have been used to make strained single crystalline silicon containing materials that have applications in the semiconductor industry. One approach involves developing the strain at the substrate level before the device (such as a transistor) is fabricated. For example, a thin single crystalline silicon layer can be provided with tensile strain by epitaxially depositing the silicon layer on a strain-relaxed silicon germanium layer. In this example, the epitaxially deposited silicon is strained because its lattice constant follows the larger lattice constant of the underlying silicon germanium. Tensile strained epitaxially deposited silicon typically exhibits increased electron mobility.

Another approach for fabricating strained silicon crystalline silicon containing materials is by substitutional doping, wherein the dopants replace silicon atoms in the lattice structure. For example, substitution of germanium atoms for some of the silicon atoms in the lattice structure of single crystalline silicon produces a compressive strain in the resulting substitutionally doped single crystalline silicon germanium material because the germanium atoms are larger than the replaced silicon atoms. Alternatively, tensile strain is provided in single crystalline silicon by substitutional doping with carbon, because carbon atoms are smaller than the silicon atoms that they replace.

BRIEF SUMMARY OF THE INVENTION

Disadvantageously, the use of etchants causes many selective deposition chemistries to produce slow deposition rates, such that some or all of the throughput gained by omitting patterning and etching steps is lost due to the slower deposition rate. Furthermore, substitutional doping is often complicated by the tendency for the dopant to incorporate interstitially in domains or clusters within the silicon, rather than by substituting for silicon atoms in the lattice structure. Therefore, improved methods for performing selective epitaxial deposition of doped semiconductor materials have been developed.

In one embodiment of the present invention, a method for depositing a carbon doped epitaxial semiconductor layer comprises maintaining a pressure of greater than about 700 torr in a process chamber housing a patterned substrate having exposed single crystal material. The method further comprises providing a flow of a silicon source gas to the process chamber. The silicon source gas comprises dichlorosilane. The method further comprises providing a flow of a carbon precursor to the process chamber. The method further comprises selectively depositing the carbon doped epitaxial semiconductor layer on the exposed single crystal material.

In another embodiment of the present invention, a method comprises positioning a patterned substrate in a process chamber. The patterned substrate has a plurality of exposed fields of semiconductor material defined by a field isolation oxide mask. The method further comprises providing a flow of $(SiH_zCl_{3-z})_xCH_{4-x-y}Cl_y$ to the process chamber, wherein $1 \leq x \leq 4$, and $0 \leq y \leq 3$, and $(x+y) \leq 4$, and $0 \leq z \leq 3$ for each of the $SiH_3Cl_{3-z}$ groups. The method further comprises providing a flow of a silicon source gas to the process chamber. The method further comprises selectively depositing a carbon doped epitaxial semiconductor material onto the plurality of exposed fields of semiconductor material. The process chamber is maintained at a pressure greater than about 500 torr during the deposition. The carbon doped epitaxial semiconductor material is deposited onto the plurality of exposed fields of semiconductor material at a rate greater than about 5 nm min$^{-1}$.

In another embodiment of the present invention, a method of forming a transistor device on a substrate in a reaction chamber comprises defining, on the substrate, a plurality of active areas among a plurality of shallow trench isolation elements. The method further comprises providing a flow of dichlorosilane into the reaction chamber. The method further comprises providing a flow of $(SiH_zCl_{3-z})_xCH_{4-x-y}Cl_y$ into the reaction chamber, wherein $1 \leq x \leq 4$, and $0 \leq y \leq 3$, and $(x+y) \leq 4$, and $0 \leq z \leq 3$ for each of the $SiH_3Cl_{3-z}$ groups. The method further comprises depositing a tensile strained Si:C material onto the active areas at a first deposition rate $d_1$. The first deposition rate $d_1$ is greater than about 5 nm min$^{-1}$. The method further comprises depositing a Si:C material onto the trench isolation elements at a second deposition rate $d_2$, wherein $d_1 \geq 100 \, d_2$.

In another embodiment of the present invention, an apparatus for depositing semiconductor materials comprises a source of dichlorosilane vapor. The apparatus further comprises a source of $(SiH_zCl_{3-z})_xCH_{4-x-y}Cl_y$ vapor, wherein $1 \leq x \leq 4$, and $0 \leq y \leq 3$, and $(x+y) \leq 4$, and $0 \leq z \leq 3$ for each of the $SiH_3Cl_{3-z}$ groups. The apparatus further comprises a carrier gas source. The apparatus further comprises a gas distribution network that connects the source of dichlorosilane vapor, the source of $(SiH_zCl_{3-z})_xCH_{4-x-y}Cl_y$ vapor, and the carrier gas source to a single wafer chemical vapor deposition chamber configured for deposition of semiconductor materials under atmospheric pressure. The apparatus further comprises a control system configured to deliver dichlorosilane vapor and $(SiH_zCl_{3-z})_xCH_{4-x-y}Cl_y$ vapor to the gas distribution network under conditions suited to selectively deposit a Si:C material on portions of a substrate within the deposition chamber without depositing on other portions of the substrate.

BRIEF DESCRIPTION OF THE DRAWINGS

Exemplary embodiments of the methods and structures disclosed herein are illustrated in the accompanying drawings, which are for illustrative purposes only. The drawings comprise the following figures, in which like numerals indicate like parts.

DETAILED DESCRIPTION OF THE INVENTION

Figure 1:
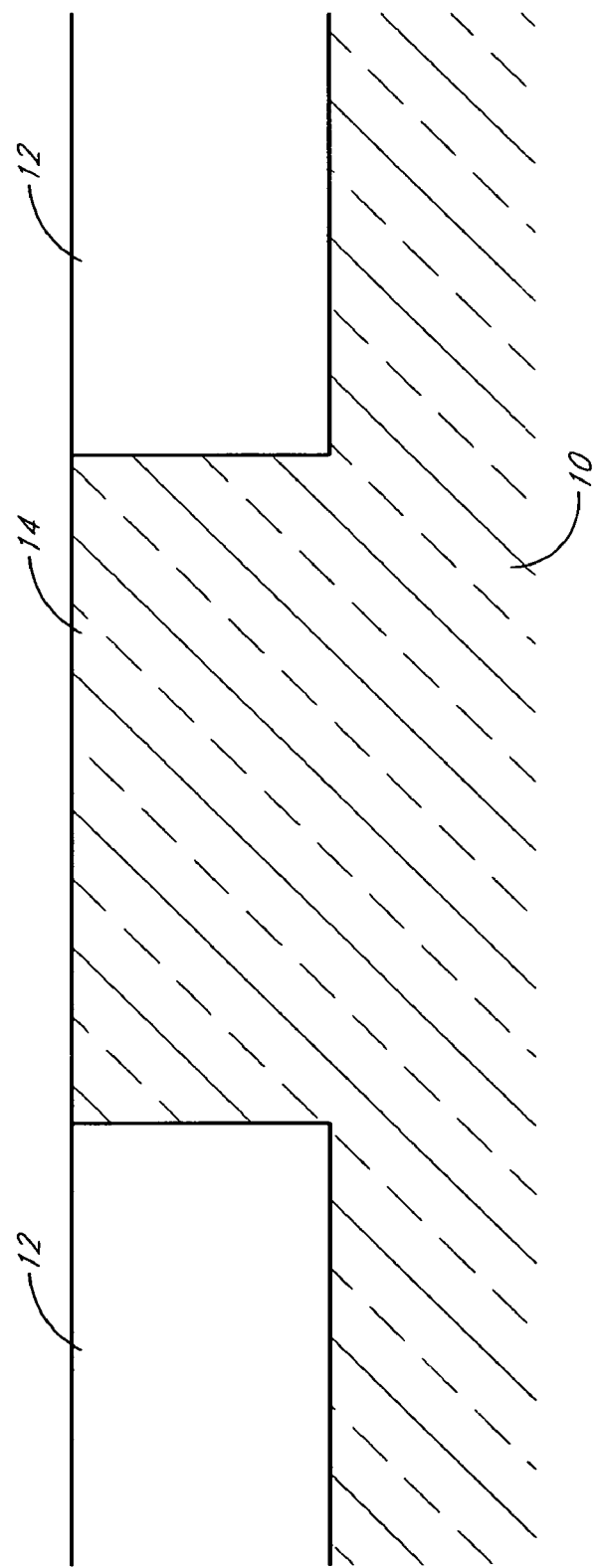
FIG. 1 is a cross-sectional view of an example silicon wafer substrate having a plurality of field isolation regions.

Introduction.

Disclosed herein are exemplary embodiments of improved methods for performing selective epitaxial deposition of semiconductor materials, including in situ carbon-doped semiconductor materials. Certain of the CVD techniques disclosed herein produce semiconductor films with improved crystal quality, improved electrical activation of incorporated dopants, and improved growth rate. In certain embodiments, highly n-doped selective deposition is possible under atmospheric conditions using dichlorosilane as a silicon precursor, dopant hydrides, and optionally, HCl to improve selectivity. Carbon precursors, such as methylsilane ($CH_3SiH_3$), are optionally added to the process gas mixture to form films that include carbon. Deposition at pressures above the low pressure chemical vapor deposition ("LPCVD") and reduced pressure chemical vapor deposition ("RPCVD") pressure regimes, preferably greater than about 500 torr, more preferably greater than about 700 torr, and most preferably at atmospheric pressure, is optionally selective with both high dopant incorporation and high deposition rates.

The processes disclosed herein are useful for, among other things, depositing silicon containing films on a variety of substrates, but certain embodiments are particularly useful for deposition on "mixed substrates". As used herein, the term "mixed substrate" refers, in addition to its ordinary meaning, to a substrate that has two or more different types of surfaces. The surfaces are different from each other in one or more of a variety of different ways. For example, in certain applications the surfaces are made from different silicon containing materials, such as silicon, silicon nitride and silicon dioxide. Even in applications where the surfaces comprise the same element, the surfaces are still considered different if other properties are different, such as the surface electrical properties. For example, in a typical application, silicon containing layers are selectively formed over semiconductor materials while minimizing, and more preferably avoiding, deposition over adjacent dielectrics. Examples of typical dielectric materials include silicon dioxide, silicon nitride, metal oxide and metal silicate.

Mixed substrates include substrates having a first portion with a first surface morphology and a second portion with a second surface morphology. As used herein, "surface morphology" refers, in addition to its ordinary meaning, to the crystalline structure of the substrate surface. For example, a polycrystalline morphology is a crystalline structure that consists of a disorderly arrangement of orderly crystals and thus has an intermediate degree of order. The atoms in a polycrystalline material are ordered within the crystals, but the crystals themselves lack long range order with respect to one another. An amorphous morphology is a non-crystalline structure having a low degree of order because the atoms lack a definite periodic arrangement. Other surface morphologies include microcrystalline and single crystalline. Epitaxial films are characterized by a crystal structure and orientation that is identical to the substrate upon which they are grown, which is typically a single crystal morphology.

The single crystal morphology, which is particularly useful in many semiconductor applications, is a crystalline structure that has a high degree of order. More specifically, as used herein, the morphology descriptions "single crystal" and "single crystalline" refer, in addition to their ordinary meanings, to a predominantly large crystal structure having a tolerable number of faults therein. The crystallinity of a layer generally falls along a continuum from amorphous to polycrystalline to single crystalline; an ordinarily-skilled artisan is able to readily determine whether a crystal structure is considered single crystalline, despite a low density of faults. The atoms in a material with a single crystal morphology are arranged in a lattice-like structure that persists over relatively long distances (on an atomic scale).

Specific examples of mixed substrates include, for example, single crystal and polycrystalline; single crystal and amorphous; epitaxial and polycrystalline; epitaxial and amorphous; single crystal and dielectric; epitaxial and dielectric; conductor and dielectric; and semiconductor and dielectric. The term "mixed substrate" includes substrates having more than two different types of surfaces, and thus certain of the methods described herein for depositing silicon containing films onto mixed substrates having two types of surfaces are also applicable to mixed substrates having three or more different types of surfaces.

As used herein, the term "substrate" refers, in addition to its ordinary meaning, to either the workpiece upon which deposition is desired, or the surface exposed to deposition gases. Examples of substrates include a single crystal silicon wafer; a semiconductor on insulator ("SOI") substrate; or an epitaxial silicon, silicon germanium or III-V material deposited upon an underlying substrate. Substrates are not limited to wafers, and also include glass, plastic, or other substrates employed in semiconductor processing. Semiconductor processing is typically employed for the fabrication of integrated circuits, which entails particularly stringent quality demands, although such processing is also employed in a variety of other fields. For example, semiconductor processing techniques are often used in the fabrication of flat panel displays using a wide variety of technologies, as well as in the fabrication of microelectromechanical systems ("MEMS").

As used herein, "selective" deposition refers, in addition to its ordinary meaning, to a deposition process wherein deposition simultaneously occurs at two significantly different growth rates over two different surfaces. Deposition occurs over a first surface at a rate that is least 10× faster than the deposition rate over a second surface. Preferably, deposition occurs over a first surface at a rate that is least 100× faster than the deposition rate over a second surface. A "completely" selective deposition process typically refers to a process wherein deposition occurs over the first surface while there is no net deposition over the second surface. Other deposition ratios are used in other embodiments of selective deposition.

Deposition is suitably conducted according to various CVD methods, but the greatest benefits are obtained when deposition is conducted according to the CVD methods disclosed herein. The disclosed methods are suitably practiced by employing CVD, including plasma-enhanced chemical vapor deposition ("PECVD"), ultraviolet photo-assisted CVD, or thermal CVD. However, thermal CVD advantageously allows selective deposition to be achieved effectively with reduced risk of damaging substrates and equipment as compared to PECVD.

Typically, delivery of the precursor gases to the substrate surface is accomplished by introducing the gas mixture to a suitable chamber having the substrate disposed therein. In an example embodiment, the chamber is a single-wafer, single pass, laminar horizontal gas flow chamber that is radiantly heated. Suitable reactors of this type include the Epsilon™ series of single wafer reactors, which are commercially available from ASM America, Inc. of Phoenix, Ariz. While the methods disclosed herein are usable with alternative reactor configurations, such as a showerhead arrangement, benefits in increased uniformity and deposition rates have been found particularly effective in the horizontal, single-pass laminar gas flow arrangement of the Epsilon™ chambers, which use a rotating substrate. These advantages are particularly evident in processes that use low process gas residence times. Plasma products are optionally introduced, in situ or downstream of a remote plasma generator, but as noted above, thermal CVD is preferred.

Thermal CVD is conducted at a substrate temperature that is effective to deposit a silicon containing film over the substrate. Preferably, thermal CVD is conducted at a temperature less than 700° C. For example, in a preferred embodiment thermal CVD is conducted in the range of about 350° C. to about 675° C., more preferably between about 500° C. and about 660° C., and most preferably between about 600° C. and about 650° C. For example, in one embodiment thermal CVD is conducted between about 630° C. and about 650° C. These temperature ranges are tunable to account for the realities of actual manufacturing, such as the thermal budget, the deposition rate, the chamber volume (including single wafer and batch reactors), the preferred total and partial pressures, and the like. The substrate is heated using a variety of methods, such as resistive heating and lamp heating.

Incorporation of dopants into selectively-deposited silicon containing films by CVD using dichlorosilane is preferably accomplished by in situ doping using dopant precursors. Preferred precursors for n-type electrical dopants include dopant hydrides, including n-type dopant precursors such as phosphine, arsenic vapor, and arsine. Silylphosphines [$(H_3Si)_{3-x}PR_x$] and silylarsines [$(H_3Si)_{3-x}AsR_x$] where $0 \leq x \leq 2$ and R=H and/or D are alternative precursors for phosphorous and arsenic dopants. Such dopant precursors are useful for the preparation of preferred films as described below, preferably phosphorous-doped silicon and Si:C films. As used herein, "Si:C" represents materials that comprises silicon, carbon and optionally, other elements such as dopants. "Si:C" is not a stoichiometric chemical formula per se, and thus is not limited to materials that contain particular ratios of the indicated elements. However, in a preferred embodiment the carbon-doped silicon films have a carbon content of less than about 3%.

Example Process Integration.

FIG. 1 illustrates a example silicon wafer substrate 10. The substrate 10 optionally includes an epitaxial layer formed over a wafer or an SOI substrate. Field isolation regions 12 have been formed by conventional shallow trench isolation ("STI") techniques, defining active areas 14 in windows among the STI elements. Alternatively, other suitable methods are used to define field insulating material, including local oxidation of silicon ("LOCOS") and a number of variations on LOCOS or STI. Typically, several active areas are defined simultaneously by STI across the substrate 10, and the STI often forms a web separating transistor active areas 14 from one another. In an example embodiment, the substrate is background doped at a level suitable for channel formation.

Figure 2:
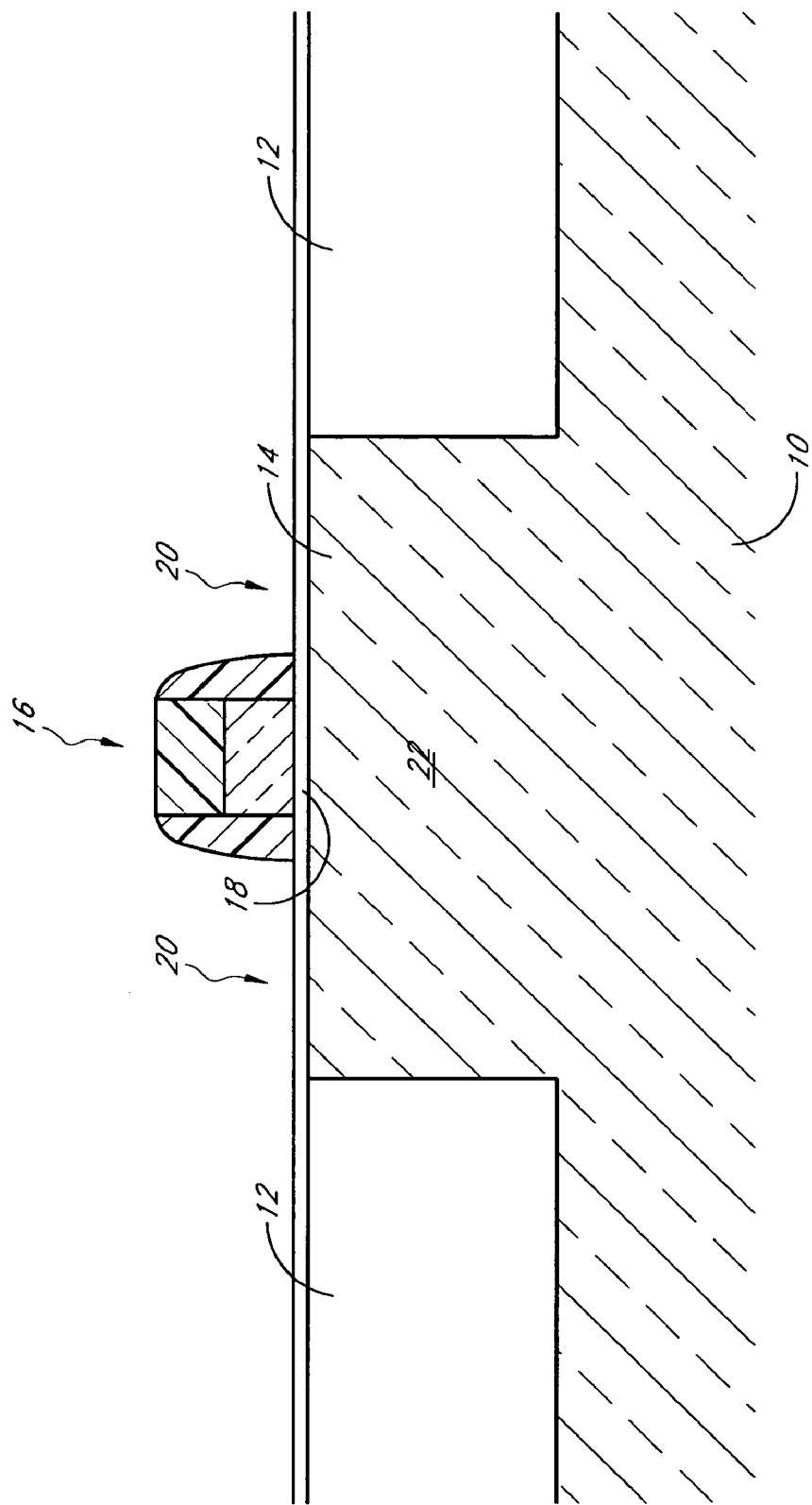
FIG. 2 is a cross-sectional view of the substrate of FIG. 1 after formation of a gate electrode over one of the active areas.

FIG. 2 illustrates the substrate 10 after formation of a gate electrode 16 over the active area 14. In the example embodiment illustrated in FIG. 2, the gate electrode 16 is illustrated as a traditional silicon electrode, surrounded by insulating spacers and cap layers, and separated from the underlying substrate 10 by a gate dielectric layer 18. However, in other embodiments the transistor gate stack has other configurations. In some process flows, for example, the spacers are omitted. In the illustrated embodiment, the gate electrode 16 defines source/drain regions 20 on either side of the transistor gate electrode 16 within the active area 14. The gate electrode 16 also defines a channel region 22 under the gate electrode 16 and between the source and drain regions 20.

Figure 3:
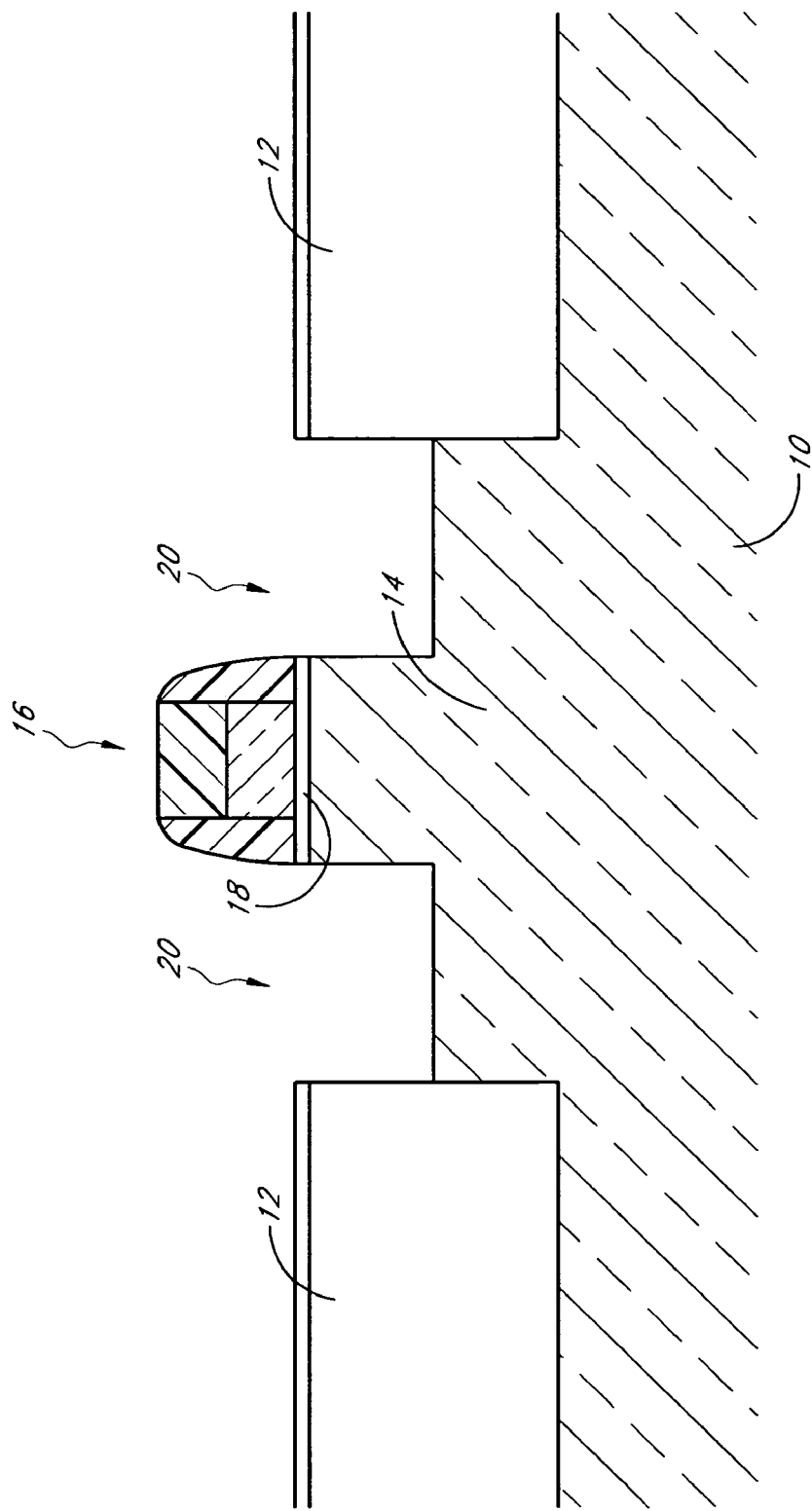
FIG. 3 is a cross-sectional view of the substrate of FIG. 2 after performing a selective etch step that removes exposed silicon.

FIG. 3 illustrates the result of a selective etch step that removes exposed silicon. In an example embodiment, a reactive ion etch ("RIE") is used to enhance vertical sidewall definition and to reduce damage to exposed oxide and nitride materials, though it will be appreciated that the methods herein are applicable to sloped wall recesses. Preferably the depth of the recesses is less than the critical thickness of the layer to be deposited in the recess, although strain on the channel can also be obtained by depositing to a depth that is greater than the critical thickness. The "critical thickness" is the thickness at which a strained layer spontaneously relaxes under a particular set of conditions. As the etched exposed silicon is essentially the source/drain regions 20 of the active area 14, this etch is referred to as a source/drain recess. In certain embodiments, a preliminary step of clearing the gate dielectric layer 18 over the source/drain regions 20 is optionally employed.

Figure 4:
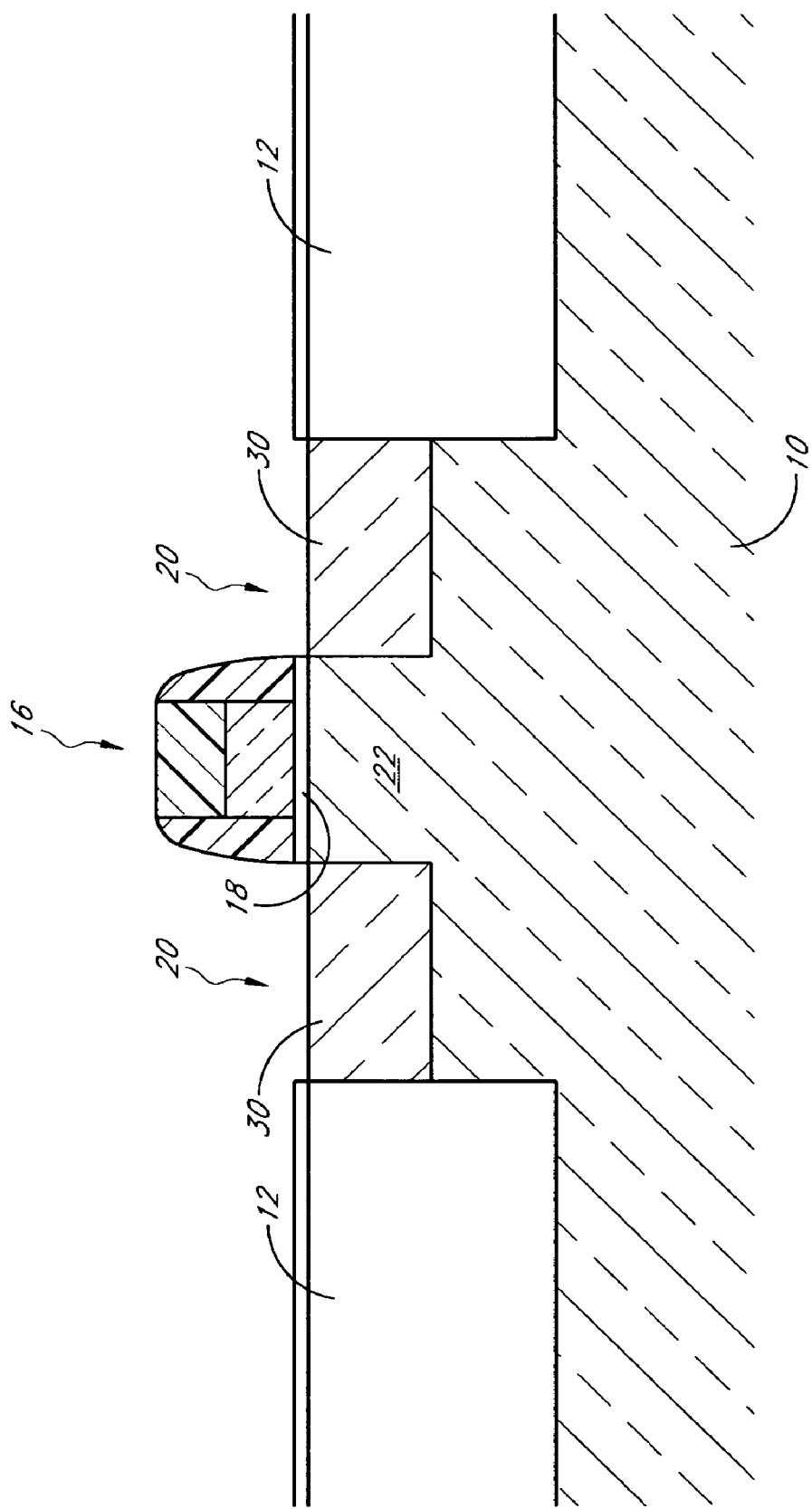
FIG. 4 is a cross-sectional view of the substrate of FIG. 3 after refilling the recessed source/drain regions with a heteroepitaxial tensile strained n-doped Si:C film using a selective deposition process.

FIG. 4 shows the result of refilling the recessed source/drain regions 20 using a selective deposition process. For example, in certain embodiments a tensile strained n-doped Si:C film is deposited into the recessed source/drain regions 20 using the techniques disclosed herein. An example feed gas used to obtain such a deposition includes a mixture of dichlorosilane, a dopant hydride such as phosphine, $CH_3SiH_3$, and HCl. Advantageously, the selectively deposited, heteroepitaxial film 30 fills the source/drain regions 20 and exerts strain on the channel region 22. In the illustrated embodiment, the heteroepitaxial film 30 is approximately flush with the surface of the channel region 22. Before deposition, the exposed, recessed semiconductor surfaces are optionally cleaned, such as with an HF vapor or an HF last dip, thereby leaving a clean surface for epitaxy thereover.

Figure 5:
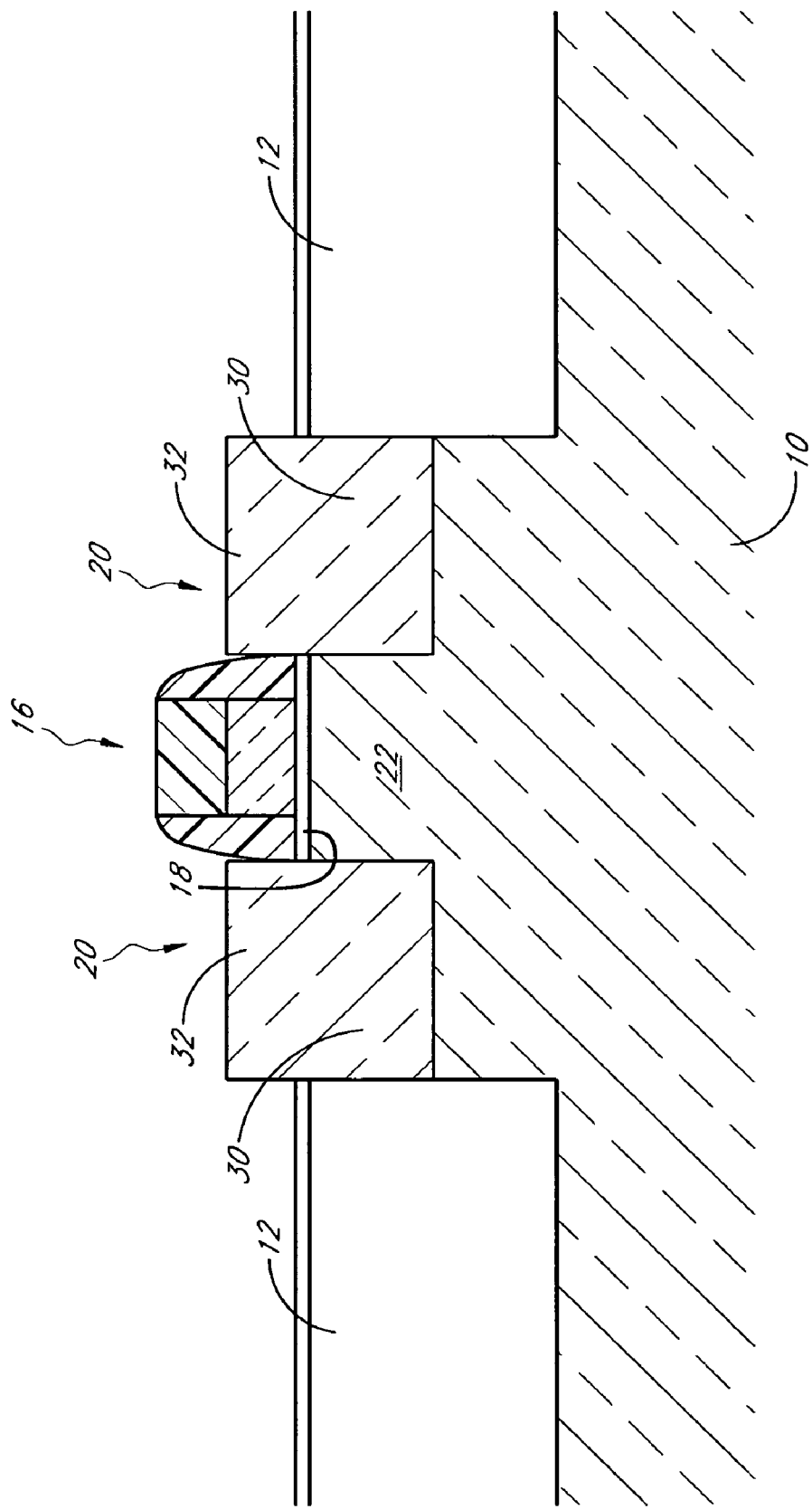
FIG. 5 is a cross-sectional view of the substrate of FIG. 4 after an optional extension of the selective deposition to form elevated source/drain regions.

FIG. 5 illustrates an optional extension of the selective deposition to form elevated source/drain regions 20 with the extended heteroepitaxial film 32. As the portion of the heteroepitaxial film 30 below the surface of the channel region 22 exerts lateral stress on the channel region 22, the extended heteroepitaxial film 32 above the surface of the substrate need not include as much or any lattice deviation from the natural silicon lattice constant. Accordingly, a carbon source gas is optionally tapered or halted for the portion of the selective deposition above the surface of the channel region 22, while the dichlorosilane flow is continued. In such embodiments, electrical dopant source gases, particularly phosphine, can be continued during deposition of the extended heteroepitaxial film 32.

The extended heteroepitaxial film 32 of FIG. 5 advantageously provides additional silicon material above the surface of the substrate 10. In certain embodiments, through subsequent processing, insulating layers are deposited and contacts are made through the insulating film to the source and drain regions 20. The additional silicon material facilitates formation of silicide contacts, which reduce contact resistance through the formation of ohmic contacts. Accordingly, nickel, cobalt or other metal is deposited into the contact hole and allowed to consume the excess silicon without disturbing electrical properties of shallow junctions for the underlying source/drain regions 20 in such embodiments.

Figure 6:
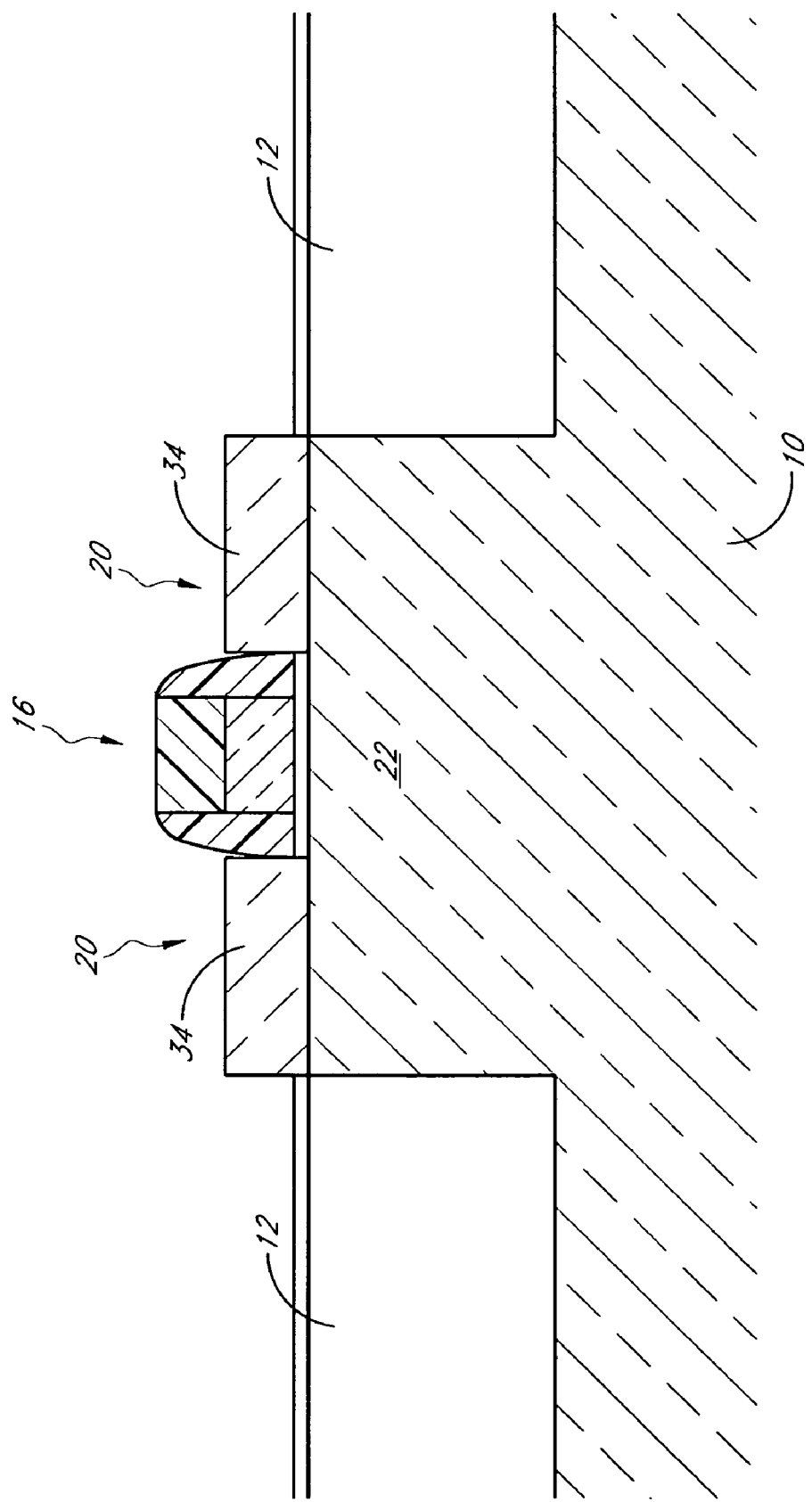
FIG. 6 is a cross-sectional view of the substrate of FIG. 2 after selectively depositing a tensile strained n-doped Si:C film.

FIG. 6 shows a modified embodiment in which the structure of FIG. 2 is subjected to selective deposition of a tensile strained n-doped Si:C film without the intervening source/drain recess process. In this case, the selective deposition raises the source/drain regions 20, thereby providing excess silicon 34 to permit consumption by contact silicidation without destroying shallow junctions. Optionally, the dopants are omitted in embodiments wherein the entire excess silicon 34 is to be consumed by contact silicidation.

Advantageously, the selective nature of the tensile strained n-doped Si:C film obviates subsequent pattern and etch steps to remove excess deposition from over field regions. Even imperfect selectivity advantageously allows use of a timed wet etch to remove unwanted deposition over insulating surfaces, rather than requiring an expensive mask step. Furthermore, superior film quality is obtained at relatively high deposition rates despite relatively low temperatures, improving throughput. For example, certain process embodiments are used to form a base structure of a heterobipolar transistor ("HBT"). Other process embodiments are used to form an elevated source/drain ("ESD") structure, a recessed source/drain structure, a contact plug for dynamic random access memory ("DRAM") and/or static random access memory ("SRAM").

Deposition of Tensile Strained, n-Doped Si:C Films.

The lattice constant for single crystal silicon is about 5.431 Å, whereas single crystal carbon in the form of diamond has a lattice constant of about 3.567 Å due to the smaller size of carbon atoms as compared to silicon atoms. Accordingly, it is possible to introduce tensile strain into single crystalline silicon by substitutional doping with carbon. In addition, substitutional incorporation of smaller carbon atoms creates more room for large dopant atoms. For such a process, a small amount of organic silicon precursor, such as monomethyl silane, is added to the process chamber as a source for both silicon and carbon.

Tensile strained Si:C films advantageously exhibit improved electrical carrier mobility, and particularly hole mobility, in semiconductors, thereby improving device efficiency. When the Si:C films are deposited to a thickness that is less than the critical thickness, and a dopant hydride such as phosphine is added to the process flow, the deposited layer remains tensile strained and hole mobility is significantly improved, which is particularly advantageous in n-channel metal oxide semiconductor ("NMOS") applications. This is analogous to boron-doped silicon germanium films that are used in p-channel metal oxide semiconductor ("PMOS") devices.

Furthermore, use of phosphine to dope a Si:C film provides advantages that are not present even when other n-type dopants are used. For example, when a Si:C film is doped with phosphine, the tensile strain in the film is maintained, or is even increased slightly (for example, by about 0.2%). The presence of carbon in the Si:C lattice suppresses phosphorous dopant diffusion, thereby enabling films with sharp dopant profiles to be formed. It is difficult to grow films with sharp dopant profiles when other n-type dopants are used.

However, from a practical standpoint, selective epitaxial growth of low-resistance n-doped Si:C films presents challenges that are not present in the context of selective epitaxial growth of p-doped silicon germanium films. For example, Applicant has determined that substitutional carbon incorporation is enhanced by both lower deposition temperatures and higher growth rates. However, the growth rate for Si:C films decreases with decreasing deposition temperature. Furthermore, use of dichlorosilane as a silicon precursor for selective epitaxial growth of single crystal silicon films typically results in low growth rates, and is enhanced by use of relatively high deposition temperatures (for example, between about 800° C. and about 850° C.). Using conventional deposition techniques, supplying dichlorosilane as a silicon precursor at temperatures less than about 750° C. results in a chlorine-terminated surface, with only negligible desorption.

As disclosed herein, HCl is often used to enhance selectivity, particularly in processes using silicon precursors which do not lend themselves to selective growth, such as silane, $Si_2H_6$, $Si_3H_8$ and partially or fully chlorinated disilanes (that is, $Si_2H_nCl_{6-n}$, wherein $1 \leq n \leq 6$). Without being limited by theory, it is believed that presence of HCl in the reaction chamber during silicon deposition results in the etch products $SiCl_3H$ and $SiCl_4$. In this case, the etching of a nucleated silicon surface proceeds according to the following net reactions:

$$Si + 3HCl \rightarrow SiCl_3H \uparrow + H_2 \uparrow$$

$$Si + 4HCl \rightarrow SiCl_4 \uparrow + 2H_2 \uparrow$$

Mass changes due to these chemical reactions on the surface of the silicon substrate affect the concentration of the respective species at the substrate surface. Specifically, the concentration of the species at the substrate surface is governed by a balance between these chemical reactions and diffusion fluxes generated by concentration and temperature gradients.

Spectra obtained by residual gas analysis provides additional information on the successive reactions that produce the etch products $SiCl_3H$ and $SiCl_4$. Without being limited by theory, it is believed that these reactions are as follows:

$$Si + HCl \rightarrow {}^*SiCl + \tfrac{1}{2}H_2 \uparrow$$

$$^*SiCl + HCl \rightarrow {}^*SiCl_2 + \tfrac{1}{2}H_2 \uparrow$$

$$^*SiCl_2 + HCl \rightarrow SiCl_3H \uparrow$$

The asterisk symbol * indicates chemisorbed states of SiCl and $SiCl_2$ on the surface of the silicon substrate. The resulting $SiCl_3H$ does not remain on the substrate surface because it has a relatively low boiling point (about 32° C.) and a relatively high vapor pressure. Because there is a relatively large concentration of HCl in the gas phase about the silicon substrate, $SiCl_3H$ reacts with HCl to from $SiCl_4$ according to the following reaction:

$$SiCl_3 + HCl \rightarrow SiCl_4 + \tfrac{1}{2}H_2$$

This reaction occurs in the gas phase.

Both dichlorosilane and $SiHCl_3$ are suitable silicon precursors for epitaxial growth of single crystal silicon, according to the following reactions:

$$SiCl_2H_2 \rightarrow SiCl_2 + H_2$$

$$SiCl_2H_2 \rightarrow SiHCl + HCl$$

$$SiHCl_3 \rightarrow SiCl_2 + HCl$$

$$^*SiCl_2 + H_2 \rightarrow Si(s) + 2HCl \uparrow$$

The balance for whether deposition or etch occurs according to the following reaction $$^*SiCl_2 + H_2 \leftrightarrows Si(s) + 2HCl,$$

and is determined by the ratio $$\frac{[HCl]^2}{[SiCl_2][H_2]}.$$

In an example embodiment, this balance is tuned by holding the flow of dichlorosilane relatively constant while increasing the flow of HCl into the reaction chamber until selective deposition is achieved. In an alternative embodiment, the flow of $H_2$ is reduced to favor the etch process, or is increased to favor the deposition process. Reducing the flow of $H_2$ helps to improve precursor consumption by reducing dilution, increasing partial pressures of the etchants, and reducing gas velocity.

Other silicon precursors, such as silane, $Si_2H_6$, $Si_3H_8$ and partially or fully chlorinated disilanes (that is, $Si_2H_nCl_{6-n}$, wherein $1 \leq n < 6$) are also suitable silicon precursors for epitaxial growth of single crystal silicon, especially when used as a component of a silicon precursor gas mixture that also comprises dichlorosilane. It will be appreciated that use of a silicon precursor gas mixture that comprises dichlorosilane advantageously enables the amount of HCl present in the reaction chamber to be reduced, thereby resulting in higher film purity, since commercially available HCl is typically has high contamination levels (for example, moisture) by semiconductor processing standards. The endothermic reaction of dichlorosilane in the absence of HCl turns into an exothermic reaction in the presence of HCl. In embodiments wherein the silicon source gas consists essentially of dichlorosilane, there is relatively little decomposition of the dichlorosilane at the reaction temperatures and pressures disclosed herein, thus resulting in relatively low precursor utilization. Adding one or more supplemental silicon sources to the reaction chamber, such as silane, $Si_2H_6$, $Si_3H_8$ and/or partially or fully chlorinated disilanes (that is, $Si_2H_nCl_{6-n}$, wherein $1 \leq n < 6$), or replacing dichlorosilane with one or more of these supplemental silicon sources, causes the reaction to become more exothermic by tapping the energy stored in the silane, $Si_2H_6$, $Si_3H_8$ or partially or fully chlorinated disilane (that is, $Si_2H_nCl_{6-n}$, wherein $1 \leq n < 6$) molecule. This allows the energetic barrier for precursor decomposition to be overcome more easily, thus resulting in better precursor utilization and higher growth rates.

For example, in certain embodiments, silane is used as a silicon precursor instead of dichlorosilane. In embodiments wherein about 75 sccm to about 100 sccm of silane is provided to the reaction chamber, the HCl flow is increased to between about 80 sccm and about 160 sccm. In such embodiments, the silane flow rate can be adjusted for a given HCl flow rate, or the HCl flow rate can be adjusted for a given silane flow rate. As described herein, in embodiments wherein silane is used as a silicon precursor instead of dichlorosilane, higher precursor utilization can be achieved, and therefore lower precursor flow rates can be used.

In certain embodiments, surface chlorine is removed using a dopant hydride such as $PH_3$ through the formation of HCl and $PCl_3$, which is a volatile etch product. Removal of surface chlorine advantageously improves growth rate as compared to intrinsic silicon growth according to the reactions set forth herein. Thus, when $PH_3$ is supplied to the reaction chamber, a portion of the $PH_3$ flow does not contribute to doping, but instead contributes to the formation of $PCl_3$. In such embodiments, $PCl_3$ is formed according to the following reaction:

As disclosed above, using a supplemental silicon source such as silane, $Si_2H_6$, $Si_3H_8$ and partially or fully chlorinated disilanes (that is, $Si_2H_nCl_{6-n}$, wherein $1 \leq n < 6$) causes the reaction to become more exothermic. In embodiments wherein $PH_3$ is supplied to the reaction chamber, this enhances the formation of $PCl_3$, $P_2$ and $P_4$.

Without being limited by theory, in certain embodiments wherein a carbon doped film is deposited using a methylsilane such as $CH_3SiH_3$ as a carbon source, the deposition is believed to proceed according to the following reaction:

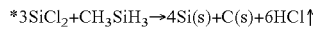

In one embodiment, a low resistivity single crystal silicon film comprises substitutionally doped carbon and an electrically active dopant, such as phosphorous. The carbon is preferably substitutionally doped at between 0.1% and 5%, more preferably between 0.5% and 2%, and most preferably between 0.8% and 1.2%. The level of substitutional doping is optionally determined using x-ray diffraction and the Kelieres/Berti relation. The film preferably has a resistivity of about 1.0 mΩ·cm or less, more preferably 0.7 mΩ·cm or less, and most preferably about 0.5 mΩ·cm or less.

In an example embodiment, a low resistivity single crystal silicon film is deposited at a temperature that is preferably between about 350° C. and about 675° C., more preferably between about 500° C. and about 660° C., and most preferably between about 600° C. and about 650° C. For example, in one embodiment the deposition is conducted between about 630° C. and about 650° C. Despite such low deposition temperatures, the film is preferably grown at greater than about 2 nm min$^{-1}$, more preferably at greater than about 5 nm min$^{-1}$, and most preferably at greater than about 8 nm min$^{-1}$. The thickness of the film is adjusted by controlling the deposition time; preferably the film has a thickness between about 20 nm and about 80 nm, and more preferably between about 25 nm and about 50 nm. The film preferably has a resistivity between about 0.4 mΩ·cm and about 1.1 mΩ·cm, and more preferably between about 0.5 mΩ·cm and about 1.0 mΩ·cm. The partial pressure of dichlorosilane in the reaction chamber is preferably between about 10 torr and about 50 torr, more preferably between about 20 torr and about 40 torr, and most preferably between about 25 torr and about 35 torr. Exemplary flow rates for the various components of the feed gas mixture are provided in Table A.

In this example, the total pressure of the reaction chamber is preferably greater than about 500 torr, more preferably greater than about 700 torr, and most preferably at about atmospheric pressure. While deposition at or near atmospheric pressure is contrary to most selective deposition processes, Applicant has found selective deposition in this pressure regime to be workable and advantageous for certain of the processes disclosed herein. In particular, deposition using certain of the processes disclosed herein advantageously results in a relatively high deposition rate and good levels of carbon incorporation.

TABLE A

| gas mixture component | preferred flow rate range | example flow rate |
|---|---|---|
| dichlorosilane | 200 sccm-500 sccm | 300 sccm |
| $H_2$ | 1 slm-10 slm | 5 slm |
| $PH_3$, 1% in $H_2$ | 100 sccm-300 sccm | 200 sccm |
| $CH_3SiH_3$, 20% in $H_2$ | 50 sccm-70 sccm | 60 sccm |
| HCl | 10 sccm-40 sccm | 12.5 sccm |

As noted above, use of a silicon precursor gas mixture that comprises dichlorosilane advantageously enables the amount of HCl present in the reaction chamber to be reduced. Because introducing HCl into the reaction chamber also causes contamination to be introduced into the reaction chamber, reducing the about of HCl in the reaction chamber typically generally results in increased film purity.

Other process components are used in other embodiments. Specifically, depending on the characteristics of the film to be deposited, the process gas mixture comprises one or more precursors selected from the group consisting of silicon source, carbon source, and phosphorous source. Specific examples of such sources include: silane, $Si_2H_6$, $Si_3H_8$, partially or fully chlorinated disilanes (that is, $Si_2H_nCl_{6-n}$, wherein $1 \leq n < 6$), and tetrasilane as silicon sources; carbon sources; monosilylmethane, disilylmethane, trisilylmethane, tetrasilylmethane and particularly methyl silanes such as monomethyl silane, dimethyl silane, trimethyl silane, tetramethylsilane, ethylsilane, diethylsilane, triethylsilane, tetraethylsilane, and methylethylsilane as sources of both carbon and silicon; and various dopant precursors as sources of electrically active n-type dopants such as phosphorous. In some embodiments, a carbon source comprises a chloromethylsilane of the formula $(SiH_zCl_{3-z})_xCH_{4-x-y}Cl_y$, wherein $1 \leq x \leq 4$, and $0 \leq y \leq 3$, and $(x+y) \leq 4$, and $0 \leq z \leq 3$ for each of the $SiH_3Cl_{3-z}$ groups.

In other embodiments, a carbon source comprises $H_3Si—CH_2—SiH_2—CH_3$ (1,3-disilabutane).

Chloromethylsilanes advantageously provide both a carbon source and an etchant source. Without being limited by theory, it is believe that because the carbon atoms in chloromethylsilanes are separated from each other by silicon atoms, chloromethylsilanes promote carbon incorporation on a molecular and atomic level. This reduces the tendency of the carbon atoms to bond together into carbon chains and clusters during deposition. Use of chloromethylsilanes also tend to enhance selectivity and increase film growth rate, while also enabling the carbon concentration in a deposited film to be manipulated without modifying the etchant flow rates. In an example embodiment, chloromethylsilanes are used in conjunction with a separate silicon source and a separate etchant for selective deposition of a Si:C film at atmospheric pressure.

Use of chloromethylsilanes advantageously enhance film uniformity by providing a carbon precursor having a decomposition rate similar to that of the silicon precursors and the etchants disclosed herein. Specifically, given certain processing conditions, such as certain deposition temperatures and pressures, use of precursors and etchants that decompose at similar rates under these conditions promotes film uniformity. The amount of chlorine and thus the weight of a particular chloromethylsilane affects the decomposition rate of that chloromethylsilane.

In a modified embodiment, helium is used instead of, or in addition to, $H_2$ as a main carrier flow. Such embodiments provide a more efficient decomposition of dichlorosilane into $SiCl_2$ and $H_2$, as described herein. The $H_2$ is not required for the silicon etch using HCl. In other embodiments, other inert gases that are used as a main carrier flow instead of $H_2$ include, but are not limited to, argon, neon, xenon and nitrogen.

Certain of the embodiments disclosed herein advantageously enable selective deposition of a low resistivity single crystal silicon film that comprises substitutionally doped carbon and an electrically active dopant. In certain embodiments, such films are grown at commercially useful rates between about 5 nm min$^{-1}$ and about 14 nm min$^{-1}$. Use of a dopant hydride (such as PH$_3$) in combination with dichlorosilane increases the growth rate of the resulting film. Use of a high partial pressure of dichlorosilane advantageously generates enough etchant to obtain selective deposition without requiring a substantial amount of HCl to be added to the process. Certain of the methods disclosed herein are usable to selectively deposit n-doped Si:C films with good crystal quality, low resistivity (sheet resistance), low surface roughness, and low defect density.

Furthermore, micro-loading effects are also reduced when certain of the embodiments disclosed herein are used. In the context of selective deposition on a patterned wafer, micro-loading effects refer to local deposition pattern nonuniformities in growth rate and film composition within the patterned windows on the wafer surface. For example, faceting is a micro-loading effect that causes a thinning of the epitaxial layer around the edges of a selective deposition pattern. Faceting disadvantageously complicates self-aligned salicidation steps that are performed after an epitaxial deposition. In certain embodiments, reducing the deposition pressure and/or reducing the deposition temperature helps to reduce or eliminate micro-loading effects. In one embodiment, within a selected deposition window, less than 20% nonuniformity is present across the deposition window. Few if any loading effects are detectable across the wafer surface when certain of the embodiments disclosed herein are employed. In particular, embodiments using a silicon precursor that includes dichlorosilane, an n-type dopant, and an atmospheric pressure deposition environment have been found to be particularly effective in reducing loading effects. Nonuniformities were found to be about the same from window to window across the wafer surface despite differences in window sizes. Thus, the average nonuniformity for a window of x cm$^2$ will differ by less than about 5% from the average nonuniformity of a window with about ½×cm$^2$.

In certain embodiments, the methods disclosed herein are used to selectively deposit tensile strained Si:C films in recessed windows of a (100) silicon substrate. Typically, when a mask is aligned in the <110> direction to etch recessed windows in a (100) silicon substrate, the (111) surface is exposed. In certain configurations, selective deposition of tensile strained semiconductor films on the (111) surface results in an increased defect density in the films. However, by aligning the mask in the <100> direction to etch recessed windows in a (100) silicon substrate, the (111) surface is not exposed. Therefore, when certain of the methods disclosed herein are used to selectively deposit tensile strained Si:C films in recessed windows of a (100) silicon substrate, the mask is optionally rotated 45° such that it is aligned in the <100> direction, thereby preventing exposure of the (111) surface.

Example Reactor System.

Figure 7:
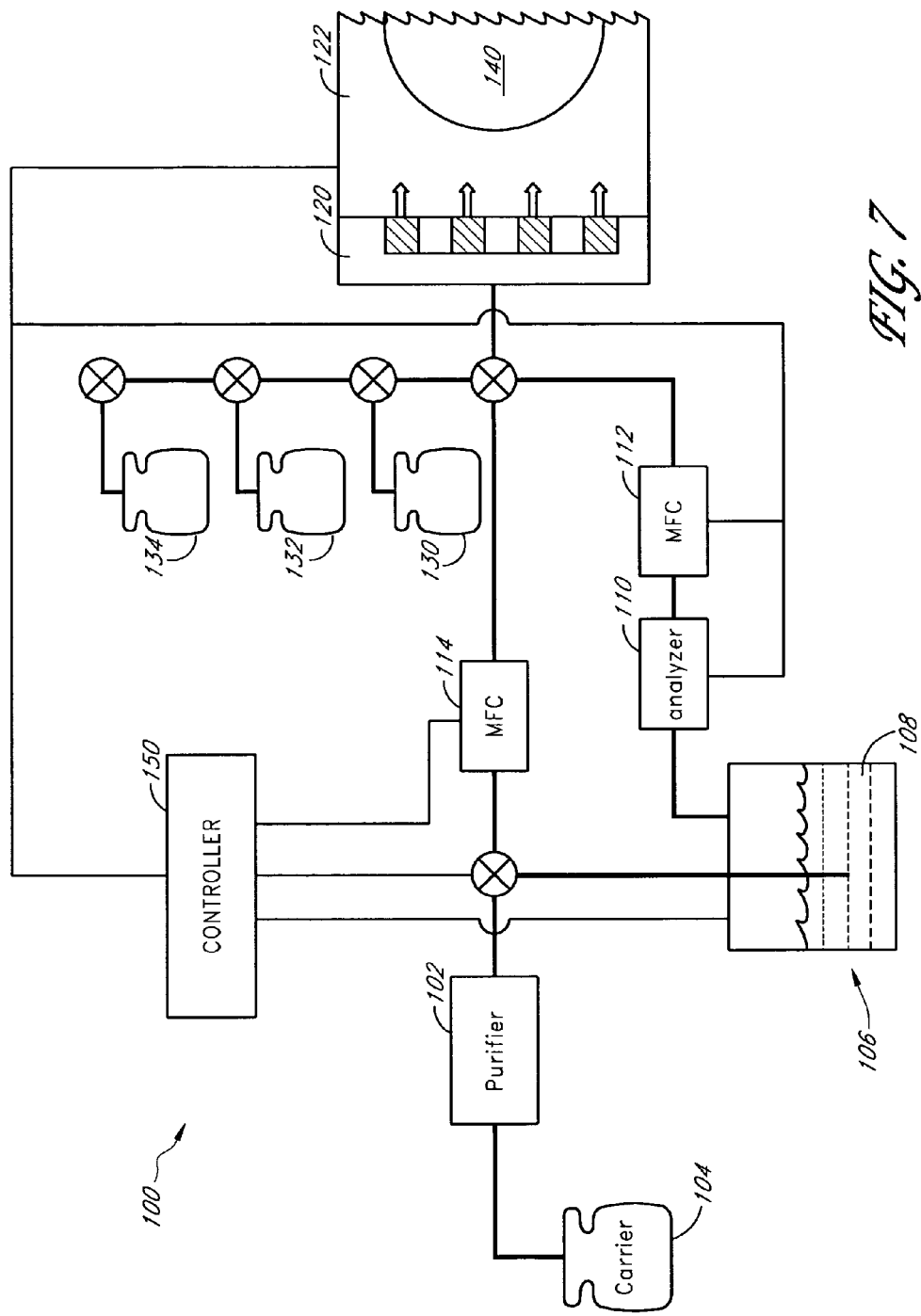
FIG. 7 is a schematic view of an apparatus employing a silicon source gas source, an etchant source, and a carrier gas source that can be used to deposit Si:C layers in accordance with an example embodiment of the invention.

FIG. 7 illustrates an example reactor system 100 employing a carrier gas, a silicon precursor, and an etchant gas. In one embodiment, the silicon precursor is dichlorosilane. As shown, a purifier 102 is positioned downstream of the carrier gas source 104. Some of the inert gas flow is shunted to a vaporizer in the form of a bubbler 106, from which the carrier gas carries vaporized dichlorosilane 108. Alternatively, the dichlorosilane is heated to increase the vapor pressure of dichlorosilane in the space above the liquid, and the carrier gas picks up dichlorosilane as it passes through that space. In any case, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller ("MFC") 112 is altered by the analyzer 110. Such analyzers are commercially available.

The flow through the MFC 112 merges with the main carrier gas through the main carrier gas MFC 114 and other reactants at the gas panel, upstream of the injection manifold 120 for the deposition chamber 122. Alternatively, the flow can merge at any point within the reactor system 100 to supply the resulting feed gas to the substrate. An etchant gas source 130, such as a source of chlorine vapor or hydrochloric acid vapor, is also provided. In the illustrated embodiment, a source for carbon 132 and a source for dopant hydride 134 are also provided.

As illustrated, the reactor system 100 also includes a central controller 150, electrically connected to the various controllable components of the system 100. The controller is programmed to provide gas flows, temperatures, pressures, and the like, to practice the deposition processes as described herein upon a substrate 140 housed within the reaction chamber 122. The controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than selective epitaxy of doped semiconductor materials.

I claim:

1. A method for depositing a carbon doped epitaxial semiconductor layer, the method comprising:
    maintaining a pressure of greater than about 700 torr in a process chamber housing a patterned substrate having exposed single crystal material and at least a second different exposed material;
    providing a flow of a silicon source gas to the process chamber, wherein the silicon source gas comprises dichlorosilane;
    providing a flow of a carbon precursor to the process chamber;
    selectively depositing the carbon doped epitaxial semiconductor layer on the exposed single crystal material relative to the second exposed material at the pressure of greater than about 700 torr, thereby depositing the carbon doped epitaxial semiconductor layer on the exposed single crystal material at a rate greater than about 5 nm min$^{-1}$.

2. The method of claim 1, further comprising providing a flow of an n-dopant hydride to the process chamber.

3. The method of claim 1, further comprising providing a flow of hydrochloric acid (HCl) to the process chamber.

4. The method of claim 1, further comprising providing a flow of hydrochloric acid (HCl) to the process chamber at a flow rate that is between about 10 sccm and about 160 sccm.

5. The method of claim 1:
further comprising providing a flow of hydrochloric acid (HCl) to the process chamber at a flow rate that is between about 80 sccm and about 160 sccm; and
wherein the silicon source gas further comprises silane.

6. The method of claim 1:
further comprising providing a flow of hydrochloric acid (HCl) to the process chamber at a flow rate that is between about 10 sccm and about 40 sccm; and
wherein the silicon source gas mixture consists essentially of dichlorosilane.

7. The method of claim 1, further comprising providing a carrier to the process chamber, wherein the carrier is selected from the group consisting of hydrogen and helium.

8. The method of claim 1, further comprising providing a carrier to the process chamber at a flow rate that is between about 1 slm and about 10 slm.

9. The method of claim 1, wherein the silicon source gas further comprises silane.

10. The method of claim 1, wherein the silicon source gas consists essentially of dichlorosilane.

11. The method of claim 1, wherein the silicon source gas further comprises at least one of silane ($SiH_4$), trisilane ($Si_3H_8$), and partially or fully chlorinated disilanes ($Si_2H_nCl_{6-n}$ (wherein $1 \leq n \leq 6$)).

12. The method of claim 1, wherein the silicon source gas has a partial pressure in the process chamber is between about 25 torr and about 35 torr.

13. The method of claim 1, wherein the silicon source gas is provided to the process chamber at a flow rate that is between about 200 sccm and about 500 sccm.

14. The method of claim 1, wherein the carbon precursor is provided to the process chamber at a flow rate that is between about 50 sccm and about 70 sccm.

15. The method of claim 1, wherein the carbon precursor is selected from the group consisting of tetrasilylmethane ($C(SiH_3)_4$), methyl silane ($CH_3SiH_3$) and 1,3-disilabutane.

16. The method of claim 1, wherein the carbon precursor comprises $(SiH_zCl_{3-z})_xCH_{4-x-y}Cl_y$, wherein $1 \leq x \leq 4$, and $0 \leq y \leq 3$, and $(x+y) \leq 4$, and $0 \leq z \leq 3$ for each of the $SiH_3Cl_{3-z}$ groups.

17. The method of claim 1, further comprising providing a flow of an n-dopant hydride to the process chamber at a flow rate that is between about 100 sccm and about 500 sccm.

18. The method of claim 1, further comprising providing a flow of phosphine ($PH_3$) to the process chamber.

19. The method of claim 1, wherein the pressure maintained in the process chamber is atmospheric.

20. The method of claim 1, wherein the carbon doped epitaxial semiconductor layer comprises between about 0.8% and about 1.2% substitutionally doped carbon in single crystal silicon.

21. The method of claim 1, wherein carbon doped epitaxial semiconductor layer has a resistivity of less than about 0.7 Ω·cm.

22. The method of claim 1, wherein carbon doped epitaxial semiconductor layer has a resistivity of less than about 0.5 mΩ·cm.

23. The method of claim 1, wherein the patterned substrate is held at a temperature between about 630° C. and about 650° C. during deposition of the carbon doped epitaxial semiconductor layer.

24. The method of claim 1, wherein the patterned substrate is held at a temperature between about 600° C. and about 660° C. during deposition of the carbon doped epitaxial semiconductor layer.

25. The method of claim 1, wherein the patterned substrate is held at a temperature between about 600° C. and about 675° C. during deposition of the carbon doped epitaxial semiconductor layer.

26. The method of claim 1, wherein the process chamber is a single wafer process chamber.

27. A method for depositing a carbon doped epitaxial semiconductor layer, the method comprising:
maintaining a pressure of greater than about 700 torr in a process chamber housing a patterned substrate having exposed single crystal material and at least a second different exposed material;
providing a flow of a silicon source gas to the process chamber, wherein the silicon source gas comprises dichlorosilane; and
providing a flow of a carbon precursor to the process chamber;
wherein the carbon doped epitaxial semiconductor layer is selectively deposited on the exposed single crystal material relative to the second exposed material at the pressure of greater than about 700 torr, thereby depositing the carbon doped epitaxial semiconductor layer on the exposed single crystal material at a rate greater than about 5 nm min$^{-1}$, and wherein the carbon doped epitaxial semiconductor layer thus deposited comprises between about 0.8% and about 1.2% substitutionally doped carbon in single crystal silicon.

28. The method of claim 27, further comprising providing a flow of an n-dopant hydride to the process chamber.

29. The method of claim 27, further comprising providing a flow of hydrochloric acid (HCl) to the process chamber.

30. The method of claim 27, wherein the silicon source gas further comprises silane.

31. The method of claim 27, wherein the silicon source gas consists essentially of dichlorosilane.

32. The method of claim 27, wherein the silicon source gas further comprises at least one of silane ($SiH_4$), trisilane ($Si_3H_8$), and dichlorosilane ($Si_2H_nCl_{6-n}$ (wherein $1 \leq n \leq 6$)).

33. The method of claim 27, wherein the carbon precursor is selected from the group consisting of tetrasilylmethane ($C(SiH_3)_4$), methyl silane ($CH_3SIH3$), and 1,3-disilabutane.

34. The method of claim 27, wherein the carbon precursor comprises $(SiH_zCl_{3-z})_xCH_{4-x-y}Cl_y$, wherein $1 \leq x \leq 4$, and $0 \leq y < 3$, and $(x+y) \leq 4$, and $0 \leq z \leq 3$ for each of the $SiH_3Cl_{3-z}$ groups.

35. The method of claim 27, further comprising providing a flow of an n-dopant hydride to the process chamber at a flow rate that is between about 100 sccm and about 500 sccm.

36. The method of claim 27, further comprising providing a flow of phosphine ($PH_3$) to the process chamber.

37. The method of claim 27, wherein the pressure maintained in the process chamber is atmospheric.

38. The method of claim 27, wherein carbon doped epitaxial semiconductor layer has a resistivity of less than about 0.7 mΩ·cm.

39. The method of claim 27, wherein the patterned substrate is held at a temperature between about 630° C. and about 650° C. during deposition of the carbon doped epitaxial semiconductor layer.

* * * * *